(12) United States Patent
Forsyth et al.

(10) Patent No.: US 9,852,238 B2
(45) Date of Patent: Dec. 26, 2017

(54) 4D VIZUALIZATION OF BUILDING DESIGN AND CONSTRUCTION MODELING WITH PHOTOGRAPHS

(71) Applicant: The Board of Trustees of the University of Illinois, Urbana, IL (US)

(72) Inventors: David Alexander Forsyth, Urbana, IL (US); Kevin Karsch, Champaign, IL (US); Mani Golparvar-Fard, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 456 days.

(21) Appl. No.: 14/690,104

(22) Filed: Apr. 17, 2015

(65) Prior Publication Data

US 2015/0310135 A1 Oct. 29, 2015

Related U.S. Application Data

(60) Provisional application No. 61/983,861, filed on Apr. 24, 2014.

(51) Int. Cl.
*G06K 9/00* (2006.01)
*G06F 17/50* (2006.01)
(52) U.S. Cl.
CPC ............... *G06F 17/5004* (2013.01)
(58) Field of Classification Search
CPC .................................. G06F 17/5004
USPC ................................. 382/100, 154
See application file for complete search history.

(56) References Cited

U.S. PATENT DOCUMENTS

| 8,249,909 B2* | 8/2012 | Watanabe | G06F 17/5004 705/7.15 |
| 9,355,495 B2* | 5/2016 | Miller | G01C 15/002 |
| 2011/0054652 A1* | 3/2011 | Heil | G05B 19/4097 700/98 |
| 2013/0147798 A1 | 6/2013 | Karsch et al. | |
| 2013/0155058 A1* | 6/2013 | Golparvar-Fard | G06T 19/006 345/419 |

OTHER PUBLICATIONS

Sameer Agarwal, et. al., "Building Rome in a Day," Communications of the ACM 54, No. 10, pp. 105-112 (Oct. 2011).
(Continued)

*Primary Examiner* — Tom Y Lu
(74) *Attorney, Agent, or Firm* — Lowenstein Sandler LLP

(57) ABSTRACT

A system and method are disclosed for, using structure-from-motion techniques, projecting a building information model (BIM) into images from photographs taken of a construction site, to generate a 3D point cloud model using the BIM and, when combined with scheduling constraints, facilitates 4D visualizations and progress monitoring. One of the images acts as an anchor image. Indications are received of first points in the anchor image that correspond to second points in the BIM. Calibration information for an anchor camera is calculated based on the indications and on metadata extracted from the anchor image, to register the anchor image in relation to the BIM. A homography transformation is determined between the images and the anchor camera using the calibration information, to register the rest of the images with the BIM, where some of those images are taken from different cameras and from different angles to the construction site.

38 Claims, 16 Drawing Sheets

(56) References Cited

OTHER PUBLICATIONS

Aubry Mathieu, Bryan C. Russell, and Josef Sivic, "Painting-to-3D Model Alignment via Discriminative Visual Elements," ACM Transactions on Graphics (TOG) 33, No. 2, pp. 1-14 (2014).

Bae Soonmin, Aseem Agarwala, and Fredo Durand, "Computational Rephotography," ACM Trans Graph 29, No. 3, pp. 1-15 (Jun. 2010).

Adrien Bartoli, "Towards Gauge Invariant Bundle Adjustment: a solution Based on Gauge Dependent Damping," In Computer Vision Proceedings., Ninth IEEE International Conference on Computer Vision, pp. 760-765 (Oct. 2003).

Amir H. Behzadan, and Vineet R. Kamat, "Visualization of Construction Graphics in Outdoor Augmented Reality," In Proceedings of the 37th conference on Winter Simulation, pp. 1914-1920 (2005).

Stéphane Côté, et.al., "Live Mobile Panoramic High Accuracy Augmented Reality for Engineering and Construction," Proceedings of the Construction Applications of Virtual Reality (CONVR), London, England, pp. 1-10 (Oct. 2013).

David Crandall, et.al., "Discrete-Continuous Optimization for Large-Scale Structure from Motion," In Computer Vision and Pattern Recognition (CVPR), IEEE Conference, pp. 3001-3008 (2011).

Matteo Dellepiane, et.al., "Assisted Multi-View Stereo Reconstruction," In 3D Vision-3DV International Conference, pp. 318-325 (2013).

Phillip S. Dunston, et. al., "Mixed Reality Benefits for Design Perception," NIST Special Publication SP, pp. 191-196 (2003).

Thomas Franken, "Minimizing User Intervention in Registering 2D Images to 3D Models," The Visual Computer 21, No. 8-10, pp. 619-628 (2005).

Yasutaka Furukawa, and Jean Ponce, "Accurate, Dense, and Robust Multiview Stereopsis," IEEE Transactions on Pattern Analysis and Machine Intelligence, vol. 32, No. 8, pp. 1362-1376 (2010).

Mani Golparvar-Fard, et. al., "Visual Representation of Construction Progress Monitoring Metrics on Time-Lapse Photographs," In Proc. Construction Management and Economics Conference, pp. 1-10 (Retrieved on Aug. 18, 2015).

Mani Golparvar-Fard, "Visualization of Construction Progress Monitoring with 4D Simulation Model Overlaid on Time-Lapsed Photographs," Journal of Computing in Civil Engineering, vol. 23, No. 6, pp. 391-404 (2009).

Mani Golparvar-Fard, "Integrated Sequential As-Built and As-Planned Representation with D4AR Tools in Support of Decision-Making tasks in the AEC/FM industry," Journal of Construction Engineering and Management, pp. 1100-1116 (Dec. 2011).

Mika Hakkarainen, Charles Woodward, and Kari Rainio, "Software Architecture for Mobile Mixed Reality and 4D BIM Interaction," In Proc. 25th CIB W78 Conference, pp. 1-8 (2009).

Amin Hammad, Hui Wang, and Sudhir P. Mudur, "Distributed Augmented Reality for Visualizing Collaborative Construction Tasks," Journal of computing in civil engineering (Nov./Dec. 2009).

Richard Hartley, Rajiv Gupta, and Tom Chang, "Stereo from Uncalibrated Cameras," In Computer Vision and Pattern Recognition, Proceedings CVPR '92., IEEE Computer Society Conference on Computer Vision, pp. 761-764 (1992).

Daniel P Huttenlocher, and Shimon Ullman, "Object Recognition using Alignment," In Proc. ICCV, vol. 87, pp. 102-111. (1987).

Kalle Kahkonen, et. al., "Integrating Building Product Models with Live Video Stream," pp. 176-188 (Oct. 22-23, 2007).

Kevin Karsch, et. al., "Rendering Synthetic Objects into Legacy Photographs," In ACM Transactions on Graphics (TOG), vol. 30, No. 6, p. 157 (2011).

Sanghoon Lee, and Ömer Akin, "Augmented Reality-Based Computational Fieldwork Support for Equipment Operations and Maintenance," Automation in Construction, vol. 4, No. 20, pp. 338-352( 2011).

David G.Lowe, "The Viewpoint Consistency Constraint," International Journal of Computer Vision, vol. 1, No. 1, pp. 57-72 (1987).

Sylvain Paris, and Frédo Durand, "A Fast Approximation of the Bilateral Filter Using a Signal Processing Approach." In Computer Vision—ECCV 2006, pp. 568-580 (2006).

Bryan C. Russell, et. al., "Automatic alignment of Paintings and Photographs Depicting a 3D Scene," 3rd International IEEE Workshop on 3D Representation for Recognition (3dRR-11), associated with IEEE International Conference on Computer Vision Workshops (ICCV) 2011, pp. 545-552 (2011).

Steven M. Seitz, et.al., "A Comparison and Evaluation of Multi-View Stereo Reconstruction Algorithms," In IEEE Computer Society Conference on Computer Vision and Pattern Recognition (CVPR'2006), vol. 1, pp. 519-526, (Jun. 2006).

Do Hyoung Shin and Phillip S. Dunstan, "Technology Development Needs for Advancing Augmented Reality-Based Inspection," Automation in Construction, vol. 19, No. 2, pp. 169-182 (2010).

Noah Snavely, "Finding Paths through the World's Photos," In ACM Transactions on Graphics (TOG), vol. 27, No. 3, p. 15 (2008).

Noah Snavely, et. al.,"Modeling the World from Internet Photo Collections," International Journal of Computer Vision 80, No. 2, pp. 189-210 (Oct. 31, 2007).

Noah Snavely, et. al., "Photo tourism: Exploring Photo Collections in 3D," In ACM transactions on graphics (TOG), vol. 25, No. 3, pp. 835-846 (2006).

Bill Triggs, et.al., "Vision Algorithms: Theory and Practice," International Workshop on Vision Algorithms Corfu, Greece, Proceedings (Sep. 21-22, 1999).

Yelda Turkan, et. al., "Automated Progress Tracking using 4D Schedule and 3D Sensing Technologies," Automation in Construction 22, pp. 414-421 (2012).

Tomás Werner and Andrew Zisserman, "New Techniques for Automated Architectural Reconstruction from Photographs," In Computer Vision—ECCV 2002, pp. 541-555 (2002).

Charles Woodward, et. al., "Mixed Reality for Mobile Construction Site Visualization and Communication," In Proc. 10th International Conference on Construction Applications of Virtual Reality (CONVR), pp. 4-5, (2010).

Changchang Wu, "Towards linear-time Incremental Structure from Motion," In International Conference on 3D Vision-3DV, pp. 127-134 (2013).

Changchang Wu, et. al., "Multicore Bundle Adjustment," In IEEE Conference on Computer Vision and Pattern Recognition (CVPR), pp. 3057-3064 (2011).

Nobuyoshi Yabuki, et. al., "Collaborative and Visualized Safety Planning for Construction Performed at High Elevation," In Cooperative Design, Visualization, and Engineering, pp. 282-285 (2010).

Stefanie Zollmann, et. al., "Image-based Ghostings for Single Layer Occlusions in Augmented Reality," In 9th IEEE International Symposium on Mixed and Augmented Reality (ISMAR), pp. 19-26 (2010).

Stefanie Zollmann, "Interactive 4D overview and detail visualization in augmented reality," In IEEE International Symposium on Mixed and Augmented Reality (ISMAR), pp. 167-176 (2012).

Photosynth, Wikipedia, the free encyclopedia, download available via web page at https://en.wikipedia.org/wiki/Photosynth, downloaded (Jul. 17, 2015).

* cited by examiner

Input: 3D model, set of unregistered images $\mathcal{U}$
Output: set of registered images $\mathcal{R}$
$\mathcal{R} \leftarrow \emptyset$
Choose initial image $I$ from $\mathcal{U}$
Select 2D – 3D point correspondences between $I$ and 3D model
Solve for camera parameters
$\mathcal{R} \leftarrow \mathcal{R} \cup I, \mathcal{U} \leftarrow \mathcal{U} \backslash I$
Compute feature matches for each image pair in collection
while $\mathcal{U} \neq \emptyset$ do
   foreach $R \in \mathcal{R}, U \in \mathcal{U}$ do
      if *Homography between R and U fits well* then
         Transfer selected 2D correspondences from $R$ to $U$
         Solve for $U$'s camera, $\mathcal{R} \leftarrow \mathcal{R} \cup U, \mathcal{U} \leftarrow \mathcal{U} \backslash U$ end
   end Perform constrained bundle adjustment on all images in $\mathcal{R}$
        Identify $U' \in \mathcal{U}$ with most triangulated features (tracks)
        if *U' has enough matched tracks* then
           Triangulate tracks in $\mathcal{R}$ corresponding to features in $U'$
        else
           Identify $U \in \mathcal{U}$ with fewest matched tracks
           Select correspondences between $U'$ and 3D model
        end
        Solve for $U'$ camera, $\mathcal{R} \leftarrow \mathcal{R} \cup U', \mathcal{U} \leftarrow \mathcal{U} \backslash U'$
        Perform constrained bundle adjustment on all images in $\mathcal{R}$
end

Algorithm 1: Model – assisted *SfM*

| Dataset | N | Rotational error (degrees) | | | Translational error (meters) | | | Reprojection error (% width) | | |
|---|---|---|---|---|---|---|---|---|---|---|
| | | Ours | VSfM | PS-ICP | Ours | VSfM | PS | PS-ICP | Ours | VSfM | PS | PS-ICP |
| Northwest A | 15 | 0.67 | 2.28 | 8.79 | 79.40 | 1.91 | 2.51 | 6.99 | 10.19 | 0.34 | 22.70 | 23.26 | 52.06 |
| Northwest B | 160 | 0.36 | 0.30 | 0.31 | 5.13 | 0.23 | 0.24 | 0.24 | 2.43 | 1.41 | 0.87 | 0.94 | 17.93 |
| West | 26 | 1.20 | 1.81 | 1.67 | 20.02 | 0.21 | 0.53 | 1.16 | 1.97 | 1.37 | 1.96 | 3.32 | 20.25 |
| Northeast | 22 | 0.17 | 1.23 | 1.21 | 6.22 | 0.15 | 1.34 | 1.14 | 9.08 | 0.50 | 3.54 | 3.12 | 17.65 |
| Basement | 10 | 1.70 | 137.90 | 12.45 | 3.29 | 0.44 | 8.15 | 1.56 | 1.55 | 1.53 | 45.61 | 8.22 | 9.67 |
| Southeast | 25 | 0.31 | 0.73 | 0.94 | 5.00 | 0.07 | 0.72 | 1.97 | 2.16 | 0.52 | 1.86 | 3.63 | 9.49 |

FIG. 12

| Dataset | N | Rotational error (degrees) | | | Translational error (unitless) | | | Reprojection error (% width) | | |
|---|---|---|---|---|---|---|---|---|---|---|
| | | Ours | VSfM | PS | Ours | VSfM | PS | Ours | VSfM | PS |
| temple (medium) | 47 | 2.03 | 2.47 | 2.84 | 0.05 | 0.02 | 0.04 | 1.94 | 2.32 | 2.02 |
| temple (small) | 16 | 2.34 | 3.72 | 3.35 | 0.05 | 0.11 | 0.07 | 2.01 | 1.91 | 2.13 |
| dino (medium) | 48 | 2.43 | 8.79 | 0.27 | 0.06 | 0.09 | 0.33 | 0.75 | 0.72 | 1.78 |
| dino (small) | 16 | 3.06 | 6.46 | 0.76 | 0.08 | 0.50 | 0.30 | 1.04 | 4.01 | 1.13 |

4D VIZUALIZATION OF BUILDING DESIGN AND CONSTRUCTION MODELING WITH PHOTOGRAPHS

REFERENCE TO EARLIER FILED APPLICATION

This application claims the benefit under 35 U.S.C. §119 (e) of U.S. Provisional Patent Application No. 61/983,861, filed Apr. 24, 2014, which is incorporated herein, in its entirety, by this reference.

TECHNICAL FIELD

The present disclosure relates to structure for motion (SfM) modeling of a construction site for purposes of progress monitoring and planning, and more particularly, to the projection of a building information model (BIM) of the site into 2D images, taken from photographs, to transform and align actual progress to the BIM in a 3D point cloud model useable, for example, in 4D visualizations.

BACKGROUND

On construction sites, visualization tools for comparing 3D architectural or construction models with actual performance are desired but often unfeasible for project managers. A common and costly problem for designing new buildings or renovating existing facilities is misinterpretation of the building design intents, or simply falling behind in scheduled milestones due to poor planning and/or tracking of building progress. On-demand access to project information during the construction phase has a significant potential for improving decision-making during on-site activities.

Current systems exist for registering large numbers of unordered ground photos, time-lapse videos, and aerial imagery with 3D architectural models, all of which have received tremendous interest in the civil engineering, computer graphics, and computer vision communities. Some progress has been made with a semi-automated system for registering 3D architectural and construction models with time-lapsed videos, and in using radio-frequency based location tracking or fiduciary trackers for augmented reality visualization of 3D computer-automated design (CAD) models.

Current techniques for construction site visualization, however, provide for little interaction from users, particularly in calibration of a 3D model and/or use of the visualization as a planning and tracking tool, thus providing users little control. Current techniques are also weak in being able to estimate and handle both static and dynamic occlusions that often exist on construction sites. Many systems require a lot of data be input from users, creating large and costly overheads before any useful visualization can be created with which track construction progress.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 3 is a flow chart of Algorithm 1, used for projecting a building information model (BIM) to images of the construction site, to create a 3D point cloud model useable for tracking construction progression and generating visualizations.

FIG. 11 is a chart including a comparison of the disclosed modeling compared against approaches using real-world construction data on an instructional facility.

FIG. 12 is a chart furthering the comparison of FIG. 11 with evaluation using ground truth data from the Middlebury Multi-View Stereo dataset.

DETAILED DESCRIPTION

By way of introduction, the present disclosure relates to a system and method for, using Structure-from-Motion (SfM) techniques, projecting a building information model (BIM) into images from photographs taken of a construction site, to register the images and thus generate a 3D point cloud model. When the BIM is combined with scheduling constraints and an overlaid version of the BIM, the disclosed system and methods may generate 4D visualizations and progress monitoring.

One of the images may act as an anchor image, e.g., an image selected by a user. Indications are received (e.g., from the user) of first points in the anchor image that correspond to second points in the BIM. Calibration information for an anchor camera is calculated based on the indications and on metadata extracted from the anchor image, to register the anchor image in relation to the BIM. A homography transformation is determined between the images and the anchor camera using the calibration information, to register the rest of the images with the BIM, where some of those images are taken from different cameras and from different angles to the construction site.

In one embodiment, a system and an efficient method is disclosed for aligning and visualizing 4D architectural/construction models with unordered photo collections, where "4D" denotes the addition to time (e.g., scheduling constraints) to a 3D model. With the disclosed interface, a user guides the registration of the model in one of the images, and the disclosed system computes the alignment for the rest of the images using the SfM techniques, in which images with nearby viewpoints are also brought into alignment with each other.

After aligning the photo(s) and model(s), the disclosed system and methods allows a user, such as a project manager or facility owner, to explore the construction site seamlessly in time, monitor the progress of construction, assess errors and deviations, and create photorealistic architectural visualizations quickly and with little user interaction. These interactions are facilitated by reasoning performed by the system, in which static and dynamic occlusions are removed seamlessly, rendering information is collected, and semantic selection tools help guide user input. This user-assisted SfM method outperforms existing techniques on both real-world construction data and established multi-view datasets, as will be further discussed.

Figure 1:
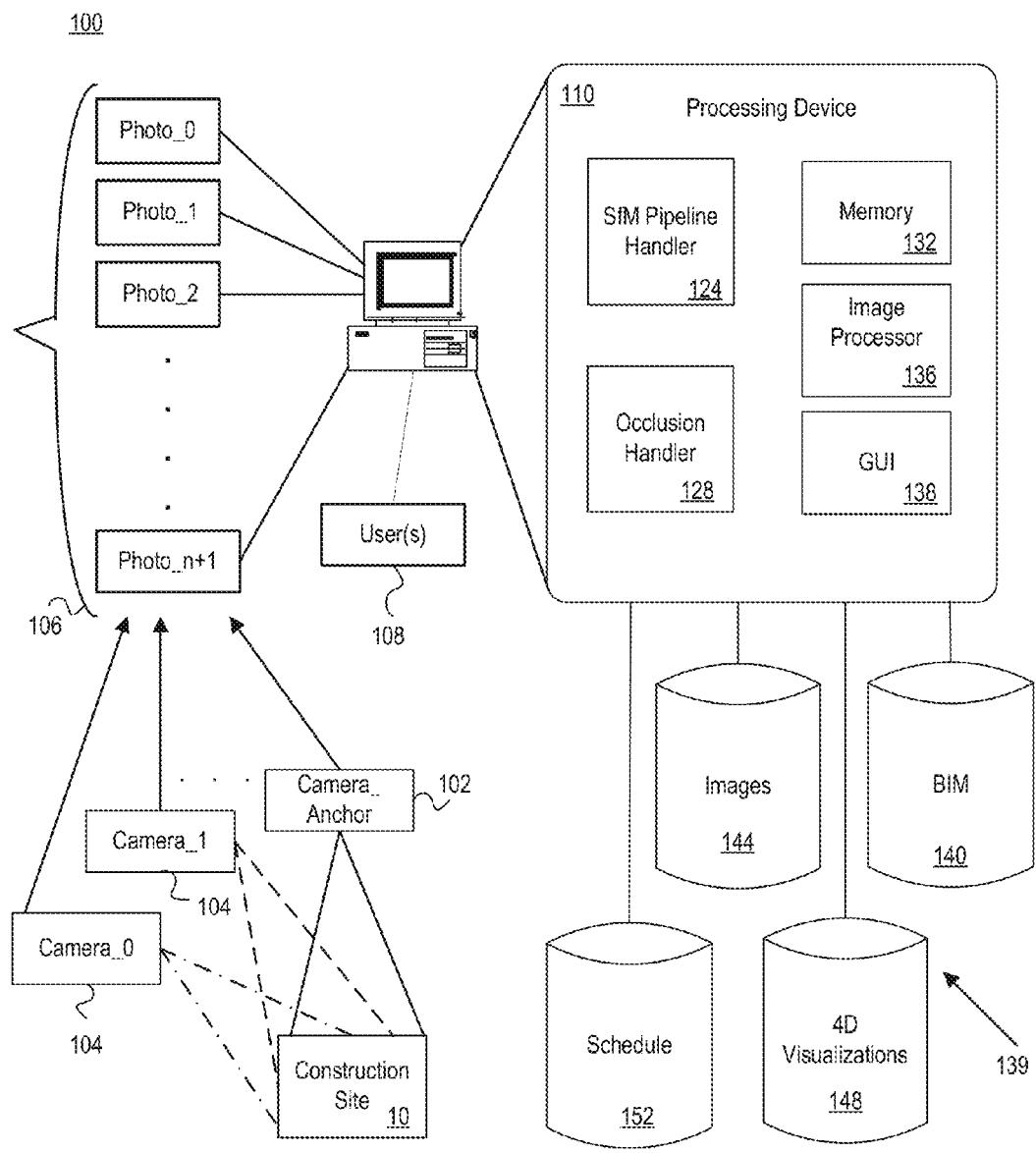
FIG. 1 is a diagram of an example system for executing the disclosed modeling and visualization of a construction site.

FIG. 1 is a diagram of an example system 100 for executing the disclosed modeling and visualization of a construction site. The system 100 may include a plurality of cameras and in particular at least one anchor camera 102 and multiple additional cameras 104. The cameras may be standard mobile devices or any digital camera that embeds metadata (such as exchangeable image file format (EXIF) data) within the digital images taken.

The system 100 may further include a plurality of photo images 106 generally referred to herein as digital images or simply images taken by the cameras of a construction site 10 (e.g., any kind of structure being built). The images 106 may be unordered and in any size, including one image up to hundreds or more images.

The system may further include one or more users 108 and a processing device 110. The users 108 may facilitate gathering the images by taking the pictures with the cameras and inputting them into the processing device 110 through known storage or transfer devices. Alternatively, or additionally, the cameras 102, 104 may stay in a certain location to take pictures on a regular schedule, and in an automated fashion, upload the images to the processing device, without user intervention. The images 106 may be uploaded directly, wirelessly, remotely over a network, and/or via the cloud.

The camera locations may be varied and provide views of the construction site 10 at different angles or perspectives. Some cameras may, therefore, capture information of the construction site that other cameras may miss. Adding images from the plurality of cameras may, however, allow for a more complete compilation of progress of construction of a building or other structure. Images may be added to the processing device 110 incrementally over time.

The processing device 110 may include a structure-from-motion (SfM) pipeline handler 124, an occlusion handler 128, memory 132, an image processor 136 and a graphical user interface (GUI) 138. The processing device may further include computer storage 139 working in conjunction with the memory 132 to store and provide to the processing device data and instructions. The computer storage 139 may include, but not be limited to, a building information model (BIM) 140, images 144, 4D visualizations, and scheduling information 152. These databases may be joined into one database and/or otherwise be related to each other through storage methodologies.

The BIM 140 may be a computer aided design (CAD) or digital architectural drawings containing computer-rendering information generally referred to as a mesh that corresponds to different features of the construction site. This mesh may be designed to scale of an actual construction site, capable of correlation to portions of images of the construction site during construction. Such correlation makes possible registering the images by projecting the 3D BIM into the 2D images, thus forming a 3D point cloud model that will be described in more detail. When the scheduling information 152 is integrated with the 3D point cloud model, the processing device 110 may form 4D visualizations for user viewing through the GUI 138, indicating building progress for monitoring and planning purposes.

The image processor 136 may help perform the modeling in conjunction with the SfM pipeline handler 124 and the occlusion handler 128. The occlusion handler 128 may compute occlusion information in relation to the 3D point cloud with the help of the SfM pipeline handler. Occlusion masks may then be developed for static and dynamic occlusions to hide occlusions or make them transparent (in an x-ray-like manner) so that the occlusions are not an impediment to viewing the continued progress of building the construction site through generated 4D visualizations.

The processing device 110 may align the images to the BIM to enable a suite of visualization tools, in which photographs can be effortlessly explored in 4D, evaluated in terms in terms of progress and building-plan deviations, and imbued with photorealistic architectural renderings. The benefits of the system 100 are relevant for both professional purposes and also customer interface.

Architectural Visualizations.

A common and costly problem for designing new buildings or renovating existing facilities is misinterpretation of the building design intents. The system 100 allows for interactive visualizations of architectural models through the GUI 138 using photographs taken from desired viewpoints, and conveys a greater spatial awareness of a finished project. These features also encourage homeowners and facility managers to interact with the design model, creating the ability to touch the design model. Building facades, architectural patterns, and materials can all be experimented with and quickly altered, and customized to individual preference. The system 100 also promotes efficiency in professional practices by shortening the duration of design development and coordination processes.

Construction Visualizations.

On-demand access to project information during the construction phase has a significant potential for improving decision-making during on-site activities. Visualizing 4D models with photographs provides an unprecedented opportunity for site personnel to visually interact with project documents, geo-localize potential errors or issues, and quickly disseminate this information to other users across the project. This visualization can also facilitate field reporting and quality inspections as it allows iterations of work-in-progress and inspections to be properly logged. A time-lapse sequence of rendered images can also act as rich workflow guidelines (especially when contractors require detailed and step-by-step instructions), facilitate onsite coordination tasks, and minimize changes of requests for information from the architects. Facility owners and managers can also easily review their project at any time during the construction phase. These all minimize inefficiencies that cause downtime and unnecessary redesign, leading to schedule delays or cost overruns.

Facility Management Visualizations.

The ability to illustrate what elements lay within and behind finished surfaces (e.g., a wall) and interact with them—either through photos previously captured during the construction/renovation phase or of a 3D architectural model—during the operation phase of existing facilities is of tremendous value to facility managers. Joint rendering of envisioned construction versus actual construction can facilitate inventory control tasks and simplify recordings related to repair histories.

Figure 2:
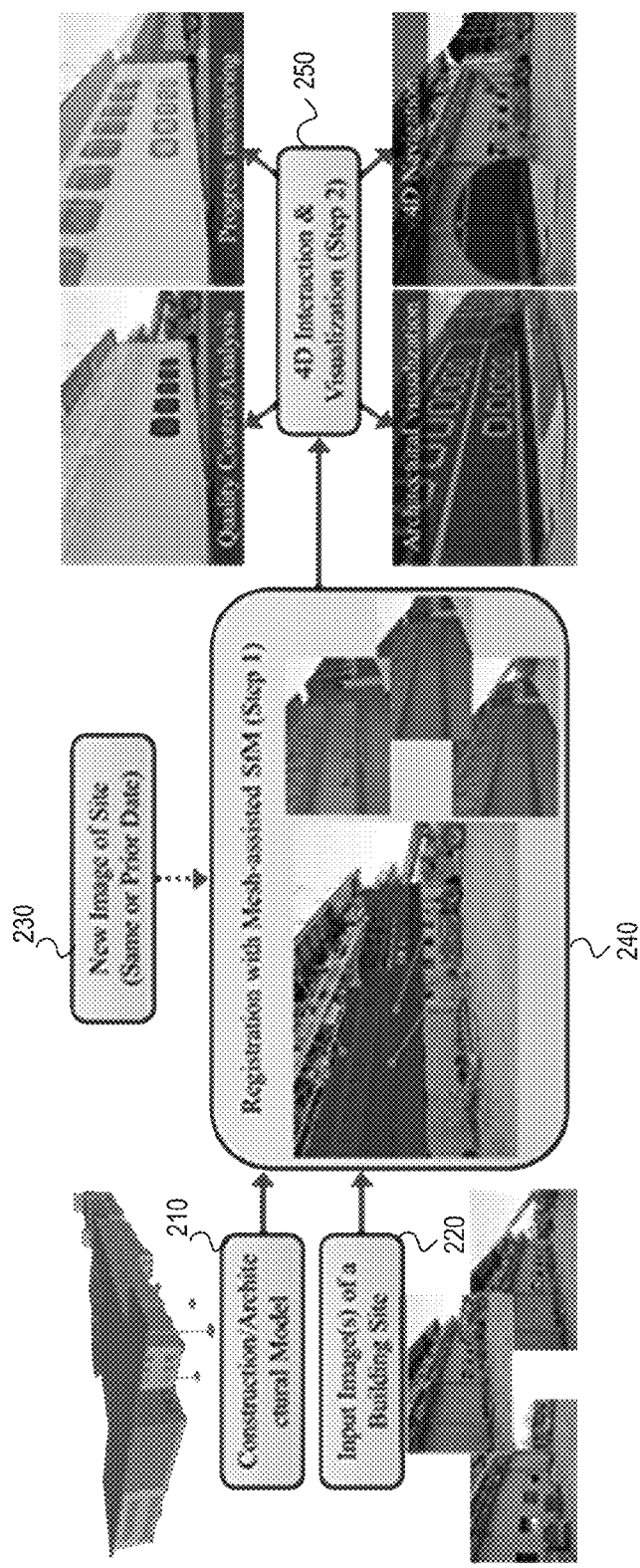
FIG. 2 is a flow chart illustrating a general flow of the disclosed methods for modeling and visualization of a construction site.

FIG. 2 is a flow chart illustrating a general flow of the disclosed methods for modeling and visualization of a construction site. FIG. 3 is a flow chart of Algorithm 1, used for projecting the BIM to images of the construction site, to create a 3D point cloud model useable for tracking construction progression and generating visualizations. The method includes receipt and storing of a construction (architectural model or BIM such as already discussed) of a construction site (210) and the input of image(s) of the construction site (220). The method may then register a new image of the site, whether the image was taken on the same or a prior date (230). The method may continue with mesh-assisted Structure-from-Motion (SfM) techniques to perform image registration in relation to the BIM (240), which leads to creation of a 3D point cloud model. The method may continue with applying the 3D point cloud model in providing 4D interactions and visualizations to users such as project managers and the like (250).

In other words, the processing device 110 may employ the unordered collection of images and the 3D BIM in a mesh-assisted SfM procedure to produce an as-built 3D point cloud model, integrate the BIM and the as-build point cloud model, and finally overlay the BIM on the images within the collection. When a new image of the site is uploaded into to the processing device, the processing device may map the new image against the mesh-assisted SfM model, derive its location and pose (intrinsic and extrinsic camera parameters), and overlay the BIM on the image, providing incremental updates to the as-built 3D point cloud model of the site.

Figure 4A:
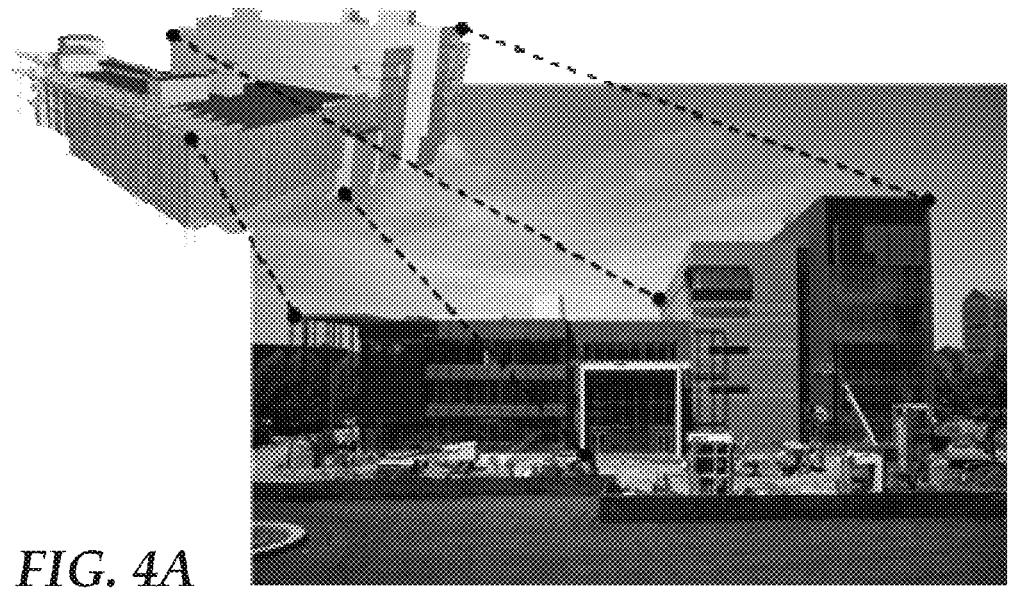
FIG. 4A is a pictorial illustration of enabling a user to set correspondences between an anchor image and a building information model (BIM).
Figure 4B:
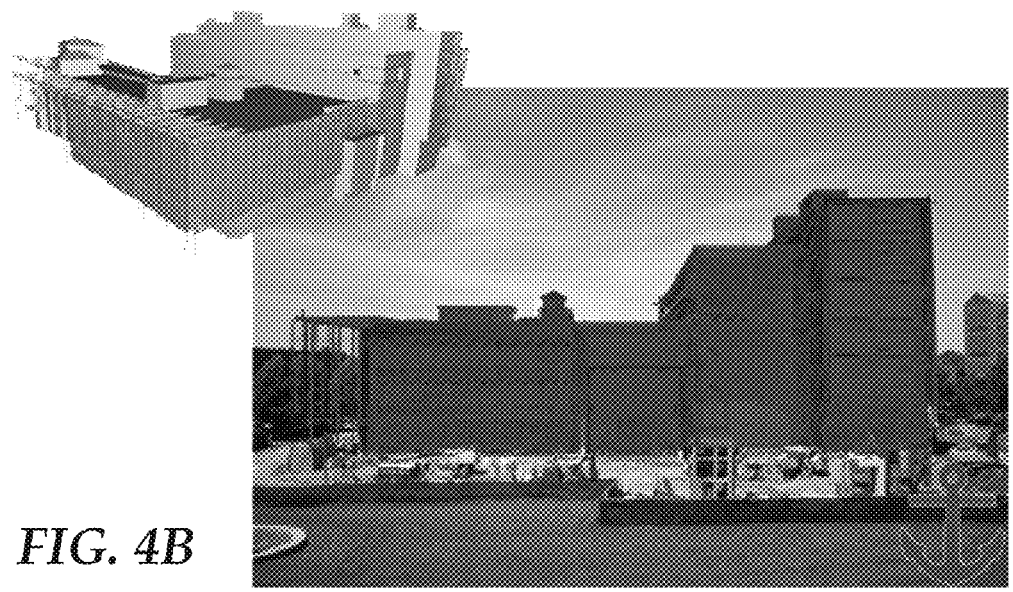
FIG. 4B is a screen shot of a resultant 3D point cloud model after registration of the anchor image of FIG. 4A, using calibration information from an anchor camera.

In performing the method of FIG. 2, the system takes advantage of a small amount of user input to register the photo images 106 with the underlying 3D architectural/construction model (the BIM). A user 108 need only specify (through image annotations) a few correspondences between an anchor image (taken from the anchor camera 102) and the underlying 3D model as illustrated in FIG. 4A, allowing the device 110 to register the model with the anchor image, using calibration information from the anchor camera (FIG. 4B). The processing device may then register other images in the collection using the disclosed SfM formulation, and remove static and dynamic occlusions. Static occlusion may be of immobile elements blocking a camera's field of view and dynamic occlusions may include moving equipment and workers. Using the information available from the 3D BIM, the device 110 may register other photos of the same site—taken at either an earlier or later date—with no additional interaction.

Once the 3D BIM is registered with the image(s), the GUI 138 may provide simple visualization metaphors that enable a user to interact with and explore the rich temporal data from the photo sets and architectural/construction models. For example, a user can quickly select elements from the photographs at any point in time, hide/show the elements, visualize the construction progress or analyze errors. Finally, photorealistic architectural renderings can be produced without the user ever using CAD, 3D modeling or rendering software: lighting, material, and camera information are collected from the model and photograph, and the model is rendered and composited back into the photograph automatically.

The availability of inexpensive and high-resolution mobile devices equipped with cameras, in addition to the Internet has enabled contractors, architects, and owners the ability to capture and share hundreds of photos on their construction sites on a daily basis. These site images are plagued with problems that can be difficult for existing SfM techniques, such as large baselines, moving objects (workers, equipment, etc.), and the constantly changing geometry/appearance of a construction site. To overcome these issues, the processing device 110 may execute a user-assisted SfM pipeline in which a user provides an accurate initial camera pose estimate (through mesh-image correspondences) which drives the remainder of the registration process.

The processing device may further seek to determine the proper camera parameters (intrinsic and extrinsic) as to register the virtual cameras with the Euclidean 3D model for each image. Here, the term Euclidean represents the similarity transformation that maps an image-based 3D model into a measurable coordinate system for engineering applications. The system models intrinsic parameters using a three parameter pinhole model with variable focal length and two radial distortion coefficients, and assume that the principal point is in the center of the image.

With continued reference to Algorithm 1 (FIG. 3), to begin the registration process, a user chooses one image from the collection (obtained from what is referred to herein as the anchor camera 102) and selects 2D locations in the image and corresponding 3D points on the 3D BIM (FIG. 4A). The GUI 138 facilitates this selection by allowing users to quickly navigate around the mesh of the 3D BIM.

Figure 5:
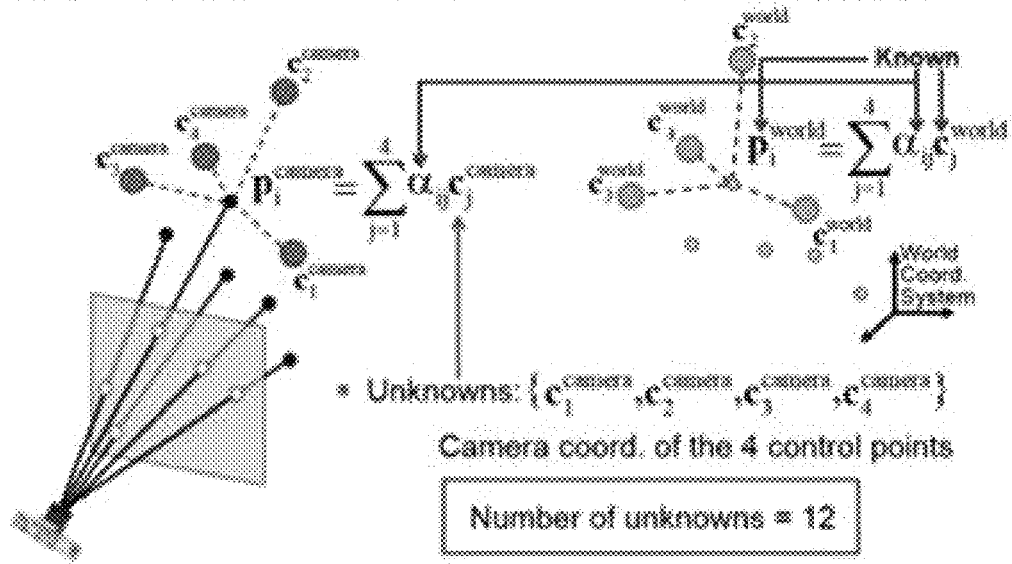
FIG. 5 is a diagram illustrating the application of a perspective-n-points (PnP) algorithm to perform matching between 2D points in images to 3D points in the BIM.

FIG. 5 is a diagram illustrating the application of a Perspective-n-Points (PnP) algorithm (from Levenberg-Marquardt) to perform matching between 2D points in images to 3D points in the BIM. Given a minimum number of corresponding points (e.g., four or more points), the processing device 110 determines camera calibration information including intrinsic parameters of the camera (focal length, the x and y coordinates of the image center, and skew) and extrinsic parameters (three rotation parameters and three translation parameters).

To more accurately identify these parameters, the processing device 100 may, through using the EXIF tag of the image used from the anchor camera, extract the focal length in millimeters. Using specification of the anchor camera 102 (e.g., sensor size), the processing device may convert the focal length from millimeters to pixels and otherwise fix the intrinsic parameters to have no radial distortion. (In the absence of EXIF tag data, the focal length may be initialized such that the field of view is 50°.)

The processing device may then execute the PnP algorithm on the points in the anchor image (indicated by the user) and the corresponding points in the 3D BIM (also indicated by the user) using the converted focal length, to accurately determine the intrinsic and extrinsic parameters by minimizing reprojection error. In other words, the PnP algorithm may extract and initialize the rest of the parameters (both intrinsic and extrinsic camera parameters) using a minimum of four point correspondences and the converted (or initialized) focal length.

An anchor image should be chosen that contains a sufficient view of the mesh of the 3D BIM such that many corresponding points in the anchor image and on the BIM are clearly visible. Knowledge of mesh-to-photo registration for one image doesn't help the SfM process as much as one might expect, but it does eliminate the coordinate system ambiguity (gauge transformation), and we later show how the 2D-to-3D correspondences can constrain and improve SfM estimates (charts of FIGS. 11 and 12). Photos of construction sites are typically object/building-centric, so many cameras will be viewing the same object. Thus, the anchor camera 102 can constrain many other images 106 in the collection.

Figure 6:
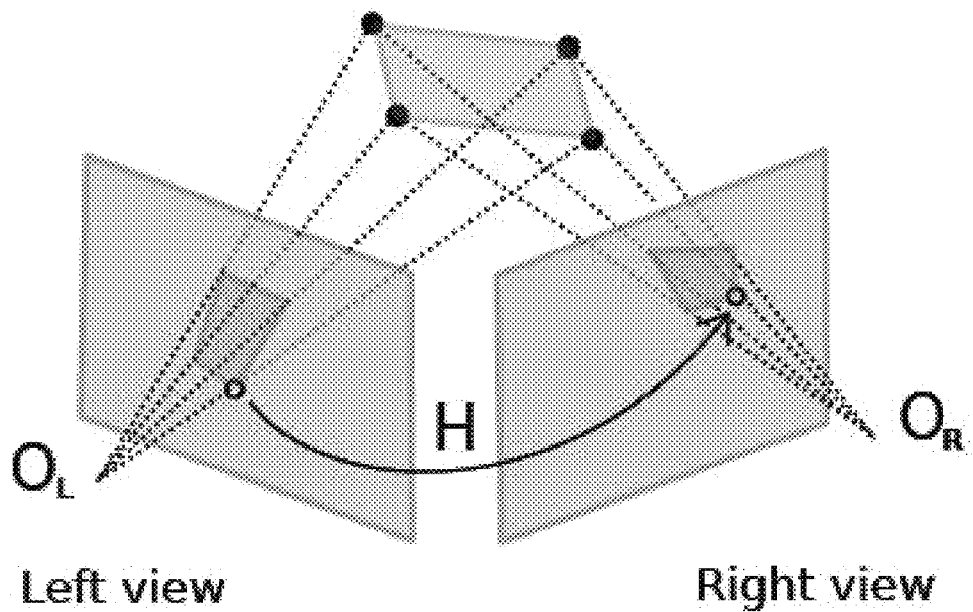
FIG. 6 is a diagram illustrating the application of a Random Sample Consensus (RANSAC) algorithm to compute homography in registering images to the BIM after calibration of the anchor camera.

With continued reference to Algorithm 1, FIG. 6 is a diagram illustrating the application of a Random Sample Consensus (RANSAC) algorithm to compute homography in registering images to the BIM after calibration of the anchor camera 102. After the anchor image is registered with the mesh of the BIM, the processing device may iteratively register other images 106 in the collection. The processing device may solve for a homography-transformation between the images and the anchor camera 102. This may be done by fitting the homography matrix between matched features between the images 106 of the collection and the anchor camera in RANSAC loop. FIG. 6 illustrates the homography-transformation of one particular point feature between two images, one from a left view and one from a right view.

The RANSAC algorithm is the most commonly used robust estimation method for homography. For a number of iterations, a random sample of four correspondences may be selected and a homography H computed from those four correspondences. These correspondences may then be classified as inlier or outlier depending on their concurrence with H. After all iterations, the iteration that contained the largest number of inliers is selected. The Final H can then be recomputed from all of the correspondences that were considered as inliers in that most appropriate iteration.

The percentage of the inliers that comply with homography H is computed for all images with respect to the anchor camera 102. At this stage, only a subset of images whose score is above K (e.g. 90%) may be chosen as additional anchor cameras. The homography transformation may be used to transform the user-selected correspondences in the anchor camera (2D points) into all these new images. The new 2D points may then be used together with the 3D correspondence within the PnP algorithm to identify the camera parameters (intrinsic and extrinsic) for the new subset of images.

A feature matching may be conducted among the images 106 and feature tracks may be generated e.g., matched features common to two or more registered images; such features can be triangulated. These tracks may be used with the PnP results for the anchor cameras within a constraint-based bundle adjustment procedure to identify the intrinsic and extrinsic parameters of all remaining cameras and the location of the points in 3D. The processing device may apply the anchor cameras and their PnP solutions as "constraints" which has the following advantages: (1) guarantees a more accurate and complete 3D point cloud model; (2) more images can be registered with respect to the 3D point cloud model; and (3) the back-projections of the BIM onto the 2D images will be more accurate (smaller rotational and translational error) in contrast to other solutions.

In performing the feature matching, the processing device may detect and match interest points across the images in the collection, and prune the matches by estimating the Fundamental matrix between image pairs using RANSAC. The processing device may then search for images that match the anchor image well up to a single homography (80% of matched features are required as inliers), warp the selected 2D points from the anchor image to these images, and solve the PnP problem for each of these images using the known 3D correspondences to register nearby images (excluding points that fall outside the image; if fewer than four remain, the processing device may not register this image). This approach is particularly useful for images from construction sites, as many images can be taken from roughly the same viewpoint with only focal length and rotational differences, such as those from a mounted camera.

Figure 7:
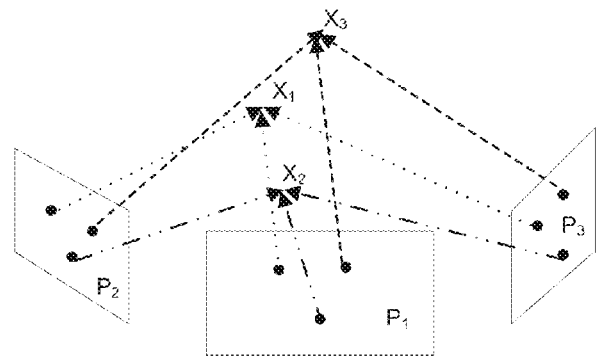
FIG. 7 is a diagram and formula illustrating application of a constraint-based bundle adjustment procedure to identify intrinsic and extrinsic parameters of cameras other than the anchor camera.

With continued reference to Algorithm 1, FIG. 7 is a diagram and formula illustrating application of a constraint-based bundle adjustment procedure to identify intrinsic and extrinsic parameters of cameras other than the anchor camera. Among all of the registered images, the processing device may perform one round of constrained bundle adjustment. This bundle adjustment may optimize over extrinsic/intrinsic camera parameters and triangulated 3D points; however, points triangulated using the anchor camera may be constrained to lie along the anchor camera's ray, and the processing device may not adjust the pose of the anchor camera (but intrinsics may change). The processing device may not triangulate matched features corresponding to rays less than two degrees apart to avoid issues of noise and numerical stability. If no matches are triangulated, bundle adjustment may be skipped.

Bundle adjustment solutions for camera and geometry that differ only by a change of coordinate system (a gauge transformation) may be required to have the same reprojection error. This effect is presents a difficulty for systems that must produce general reconstructions. The effect is particularly pronounced as the percentage of camera pairs that view the same geometry goes down. In some cases even the structure of the gauge group is not clear, and complex strategies apply. Our case is simpler: we expect a high percentage of camera pairs to share features, and so we can resolve this issue by fixing the coordinates of one camera, the anchor camera 102.

In typical SfM bundle adjustment formulations, reprojection error is minimized by simultaneously adjusting intrinsic and extrinsic camera parameters, and triangulated points X. Let $\mathbb{P} = \{\mathbb{P}_1, \ldots, \mathbb{P}_N\}$ be the set of all camera parameters corresponding to the N images, and tracks i be the pixel locations of keypoint tracks in image i. The classic bundle adjustment problem may be formulated as a nonlinear least squares problem, $$\underset{\mathbb{P}, X}{\mathrm{argmin}} \sum_{i=1}^{N} \sum_{u \in tracks_i} \|\mathrm{project}(\mathbb{P}_i, X_u) - u\|, \quad (1)$$

where $X_u$ is a triangulated point corresponding to pixel u, and project (•) is the function that projects 3D locations into 2D according to a set camera parameters.

We formulate a new version of this problem, constrained bundle adjustment, which leverages one or more calibrated cameras. We denote parameters of the anchor camera 102 as $\mathbb{P}_\dagger$. During bundle adjustment, the anchor camera may be used to constrain the 3D points such that any point triangulated using a feature point from the anchor camera must lie along the ray generated by the anchor camera. Therefore, we re-parameterize points as $X_u(t_u) = \mathbb{P}_\dagger^{center} + t_u \mathbb{P}_\dagger^{ray}(u)$, where $t_u$ is a scalar and $\mathbb{P}_\dagger^{center}$ is the anchor camera center and $\mathbb{P}_\dagger^{ray}(u)$ is the ray generated from pixel u in the anchor camera. The formulation then becomes $$\underset{\mathbb{P}\setminus\mathbb{P}_\dagger, t}{\mathrm{argmin}} \sum_{i=1}^{N} \left[ \sum_{u \in tracks_\dagger} \|\mathrm{project}(\mathbb{P}_i, X_u(t_u)) - u\| + \sum_{u \in tracks_i \setminus tracks_\dagger} \|\mathrm{project}(\mathbb{P}_i, X_u) - u\| \right]. \quad (2)$$

Notice that the anchor's camera parameters are left out of the bundle adjustment, and any tracks that are not seen by the anchor camera revert to the classic bundle adjustment formulation.

From the inventors' experience, this formulation typically provides better estimates since the model is constrained by accurate camera parameters. Also, this formulation has an added benefit of having fewer parameters to optimize over, increasing optimization efficiency and reducing variance in the estimates. One downside is that this model can be inflexible if the other initial camera estimates are too poor, and we also propose a soft-constrained" bundle adjustment in these cases:

$$\underset{\mathbb{P}\setminus\mathbb{P}_\dagger, X}{\mathrm{argmin}} \sum_{i=1}^{N} \sum_{u \in tracks_i} w_i \|\mathrm{project}(\mathbb{P}_i, X_u) - u\|, \quad (3)$$

where $w_i$ is a scalar weight dependent on each image. We set the anchor image's weight to a large value (e.g., 100), and all other image weights to 1, enforcing the reprojection error for the anchor camera to be much smaller than other cameras. This has a similar effect as Equation (2), but allows for flexibility in the 3D point locations.

Next, the processing device 110 may search for other images with a sufficient number of features corresponding to existing tracks, e.g., matched features common to two or more registered images; such features can be triangulated. The processing device may choose the image that has the fewest matches over a threshold (60 as just one example) to ensure a good match and potentially wide baseline. This camera is registered by solving a constrained PnP problem using its 2D matches corresponding to the triangulated 3D tracks, made robust with RANSAC (inliers considered within 1% of the image width).

The processing device 110 may also use the anchor camera to improve the PnP solution: using the Fundamental matrix between the anchor camera image and the image that is currently being registered, epipolar lines may be computed corresponding to the user-selected 2D locations in the anchor image; the corresponding 3D mesh locations are then constrained to lie nearby these lines (based on reprojection error). Given a set of k 3D points $X=\{X_1, \ldots, X_k\}$ and their corresponding projected pixel locations $u=\{u_1, \ldots, u_k\}$ and epipolar lines $e=\{e_1, \ldots, e_k\}$, the processing device may search for a 3D rotation (R) and translation (t) that jointly minimizes reprojection error as well as the point-to-line distance from projected points to their corresponding epipolar lines:

$$\underset{R, t}{\mathrm{argmin}} \sum_i \|x_i - u_i\| + pld(x_i, e_i), \quad (4)$$

where: $x_i = \mathrm{project}(RX_i + t, f)$ where project (X,f) projects 3D locations into the plane according to focal length f, and pld (x,l) computes the shortest distance from pixel location x to the line specified by l. In our experience, this strategy helps avoid errors due to noisy camera estimates and triangulations.

In the case that not enough features in unregistered images match existing tracks in registered images, the processing device 110 may choose the image with the least matched track of feature points. The user may then specify 2D locations in this image corresponding to 3D mesh locations selected in the starting image (this is purely an image-based task, as the 3D positions do not need to be specified again), and this image may be registered by again executing the PnP algorithm. Re-registering in this way may happen when the image graph, or sets of tracks through the image collection, is disjoint. The image with the least matched tracks may be chosen with the goal of connecting the graph, or at the very least, adding an image with large baseline. Since the user assisted in registering the chosen image, this camera may also be designated as an anchor camera. After this camera is registered, another round of constrained bundle adjustment may be performed. Until all images have been registered, this process may be repeated as outlined in Algorithm 1 (FIG. 3).

Figure 8:
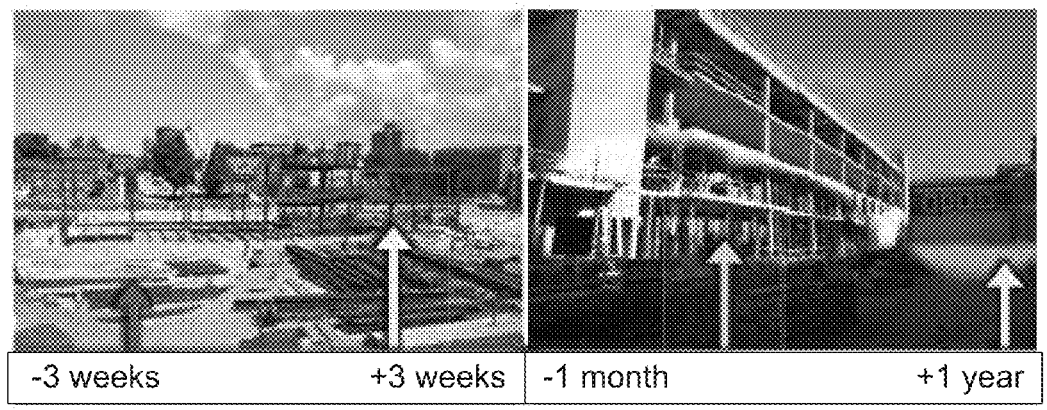
FIG. 8 is a set of screen shots with exemplary illustrations of joint visualization of image and constructions models to view construction progress.

FIG. 8 is a set of screen shots with exemplary illustrations of joint visualization of image and constructions models to view construction progress. The system 100 may allow users to navigate image and construction models in 4D. In FIG. 8, a user has selected to visualize both past and present information on each photograph.

Figure 9:
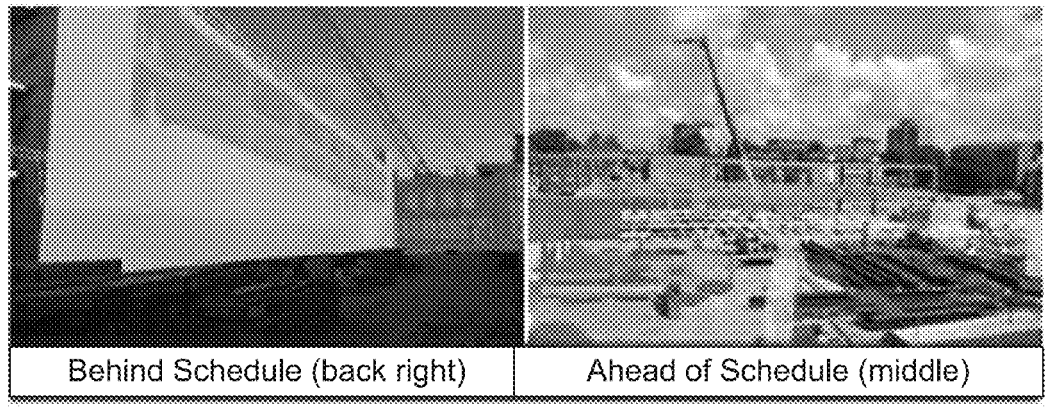
FIG. 9 is a set of screen shots with exemplary illustrations of building progress, with significant portion behind schedule on the left and some portions ahead of schedule in the middle on the right.

FIG. 9 is a set of screen shots with exemplary illustrations of building progress, with significant portion behind schedule on the left and some portions ahead of schedule in the middle on the right. Building components can also be evaluated and displayed through the GUI 138 in terms of their state of construction (time). On the left, we see that two components of the building facades are late in their construction, and on the right, the steel structure in the basement have been constructed well ahead of schedule.

Figure 10:
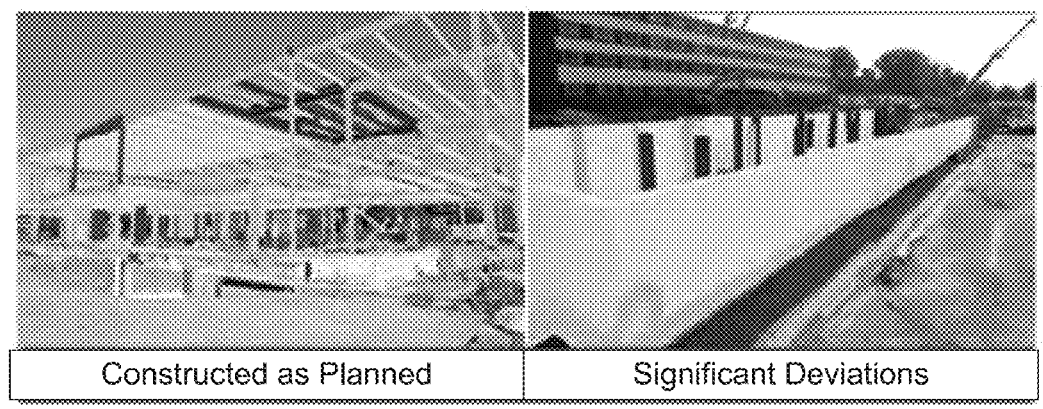
FIG. 10 is a set of screen shots with exemplary illustrations of compliance with the original construction plan (within the BIM), e.g., constructed as planned on the left and having significant deviations on the right.

FIG. 10 is a set of screen shots with exemplary illustrations of compliance with the original construction plan (within the BIM), e.g., constructed as planned on the left and having significant deviations on the right. Using the underlying point cloud model (obtained during our SfM procedure), a user can measure metric deviations in construction data.

EXPERIMENTS

We hypothesize that knowing at least one camera's pose (as in the disclosed methods) should aid camera pose and reconstruction estimates, as compared to blind, automatic SfM techniques. To test our hypothesis (and accuracy of registration), we compared our estimates to ground truth camera poses as well as camera pose estimates from established SfM methods. In total, we tested 10 different photo collections falling into two categories: real-world construction site images and object-centric images from the Middlebury Multiview Stereo dataset. We chose this data for several reasons: construction site data allows us to quantify error on real-world sites, the data vary widely in appearance, baseline, and number of photos, testing the limits of our method, and we require a corresponding mesh-model (available for our construction data, and obtainable for the Middlebury data). We compare our method to Wu's VisualSfM and Photosynth (see photosynth.net). While both methods are based on the method of Snavely et al., we found the estimates to be quite different in some cases most likely due to differences in implementation (e.g. Photosynth uses a different feature matching scheme than VisualSFM).

Construction Site Evaluation.

We first test our method on real-world construction data. Ground truth camera pose estimates do not exist for this data, so we create ground truth data by manually calibrating five of the images in each dataset (images are chosen for dataset coverage). Corresponding 2D and 3D locations are chosen by hand, allowing us to solve for the true camera pose. As our method requires the same ground truth calibration for at least one of the images (during initialization), we ensure that the the images calibrated in our method are not used in for creating ground truth (and thus not compared to).

For each photo collection, we process the images with our mesh-assisted SfM technique as well as VisualSfM and Photosynth (denoted as VSfM and PS onward). Since the models produced by VSfM and PS are not in the same coordinate system as the ground truth data, we align them with a simple procedure: (a) triangulate a set of points (hand-selected for accuracy) using both the ground truth cameras and VSfM's cameras, (b) find the similarity transformation (scale, rotation, translation) that minimizes the squared distance between the point sets, and (c) apply this transformation to VSfM's cameras. The same procedure is applied to the result from PS. For nearly all datasets, the mean squared error is <0.01 m, ensuring a good fit. There is no need to adjust the pose estimates from our method as our estimates are already in the 3D model's coordinate system.

For additional comparison, we also match the coordinate system of PS results to the ground truth by matching all triangulated features with points sampled from the 3D model using the iterative closest point algorithm; we call this method PS-ICP.

Between each of the methods and the ground truth cameras, we compute three error measures: rotational difference (angle between viewing directions), translational difference (distance between camera centers, in meters), and reprojection error of seven hand-selected ground truth 3D locations.

FIG. 11 shows the results of this experiment on the six construction site photo collections. The errors shown are averaged over all five of the ground truth calibrations.

Middlebury Evaluation.

We also test our method and others against ground truth camera pose from the Middlebury Multiview Stereo datasets. We investigate four of the datasets (dino and temple datasets, the medium and small collections), and compare our method with VisualSfM (VSfM) and Photosynth (PS). As in the construction data experiment, we compute rotational, translational, and reprojection error. Since we now have ground truth data for each of the images in the dataset, we compute the average error over all images in the dataset (excluding any which have not been successfully registered by a particular algorithm). Results are shown in FIG. 12.

Discussion.

In both experiments, we observe that our mesh-assisted SfM technique typically outperforms existing methods in the three error measures. Furthermore, incorporating 3D model data into the SfM process can be beneficial at a low cost to the user, even if the model is incomplete or inexact. We see that the results are fairly consistent across the two experiments, indicating that the disclosed methods might be suitable for "object-sized" data as well.

These experiments suggest that our method may perform better than other techniques for smaller image collections with wider baselines. For larger, more complete collections, existing automatic techniques methods may suffice, although a manual coordinate-system registration process must still be used to bring the cameras into the 3D model's coordinate system.

We also demonstrate that the improved camera pose estimates computed by our method can lead to better dense reconstructions, and helps to eliminate accumulated error (drift). Our SfM method typically produces more robust estimates than existing automatic approaches, resulting in lower reconstruction error and less drift as well as more dense multi-view stereo reconstructions.

4D Visualization of Construction Site

Once a mesh model is accurately registered to a photo, our system allows for users to analyze and visualize the site quickly and with ease. To enable more efficient interactions, the processing device first processes the registered data to extract information useful for selection, visualization, and rendering. For example, converting unordered collections into time-lapse data, identifying and removing occlusions, and extracting rendering information from building models enable users to navigate and visualize data with ease, allowing for valuable job-site visualizations to be created in minutes.

Converting Unordered Image Collections into Time-Lapse Data

Figure 13:
FIG. 13 is a melded series of photos viewed before time-lapse conversion.
Figure 14:
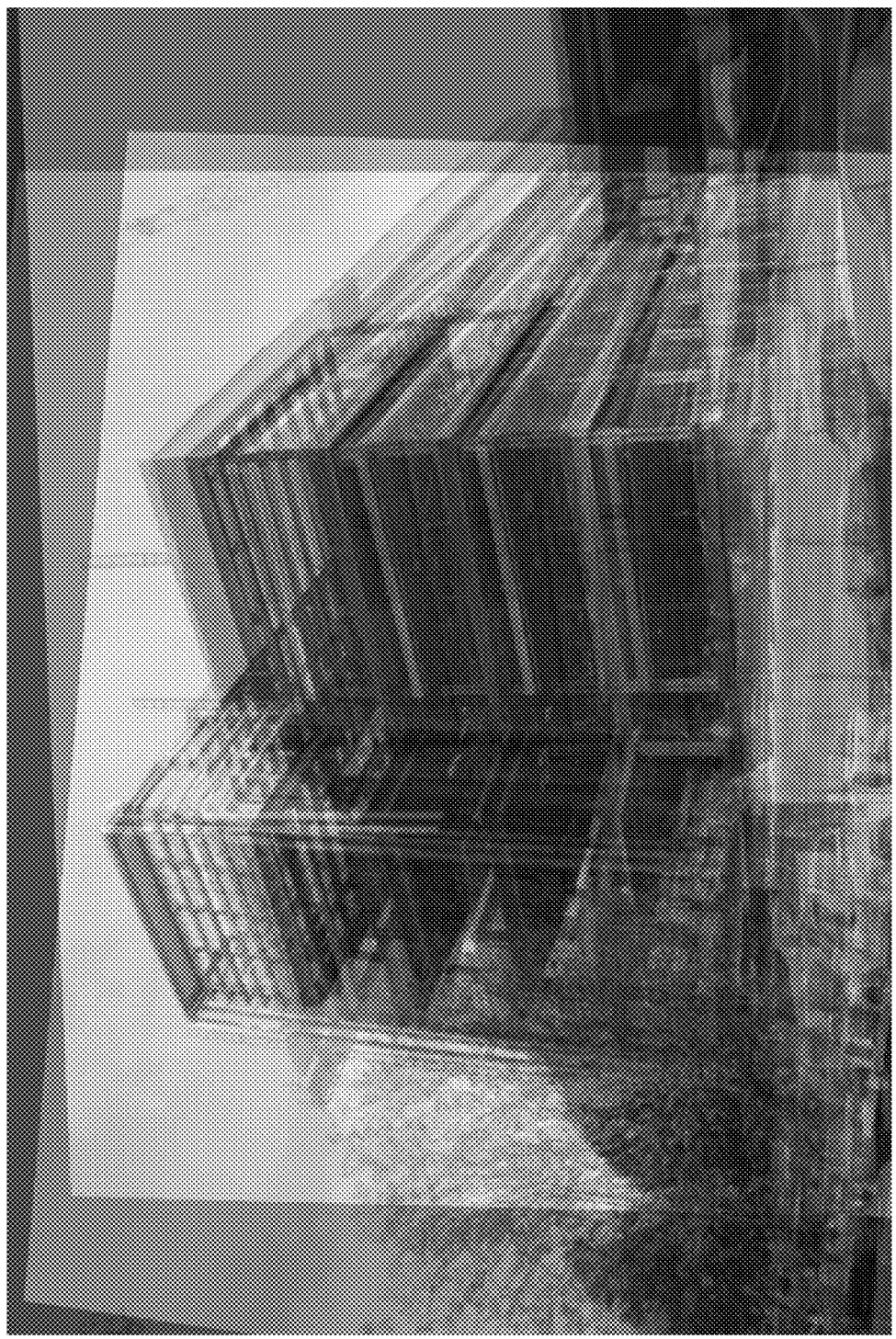
FIG. 14 is a is the melded series of photos of FIG. 13 after time-lapse conversion according to the present modeling techniques.

FIG. 13 is a melded series of photos viewed before time-lapse conversion. FIG. 14 is a is the melded series of photos of FIG. 13 after time-lapse conversion according to the present modeling techniques.

The first step in this process is, for each image, to identify other images that were taken from roughly the same viewpoint, determined by how well a single homography can model matched features in every pair of images. The processing device has already computed this data for registering the construction models to the photos, and there is no need to recompute homographic transformations. Once similar-viewpoint pairs are identified, the homography is used to transform one image into the other's view. The processing device performs this transformation at each camera location and for all nearby viewpoints, resulting in pixel-aligned temporal information. If no nearby viewpoints are found, this image cannot be traversed temporally in 2D (however, the registered 4D mesh can still be traversed).

Occlusion Identification

Figure 15:
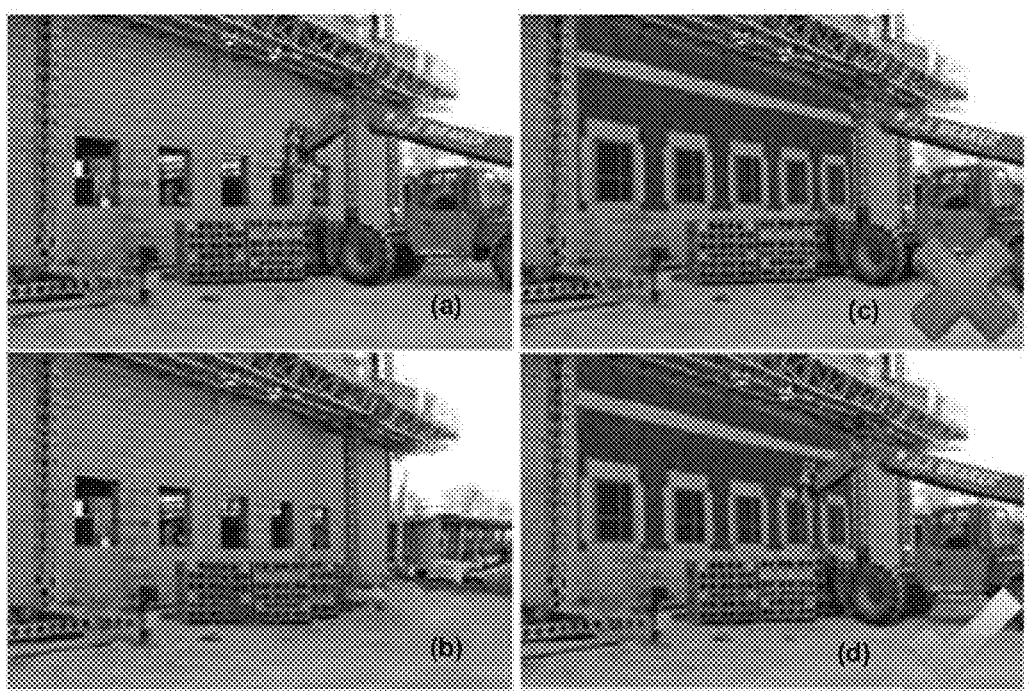
FIG. 15 is a series of photographs illustrating handling of dynamic occlusions by sampling similar viewpoints at different times so that depth layers are not confused in visualizations, wherein: (a) illustrates a telehandler partially occluding the site; (b) illustrates a clean background computed without the telehandler; (c) illustrates incorrect visualization of a portion of the telehandler; and (d) illustrates correct visualization of the telehandler after progress on façade of the building.

FIG. 15 is a series of photographs illustrating handling of dynamic occlusions by sampling similar viewpoints at different times so that depth layers are not confused in visualizations, wherein: (a) illustrates a telehandler partially occluding the site; (b) illustrates a clean background computed without the telehandler; (c) illustrates incorrect visualization of a portion of the telehandler; and (d) illustrates correct visualization of the telehandler after progress on façade of the building.

Figure 16:
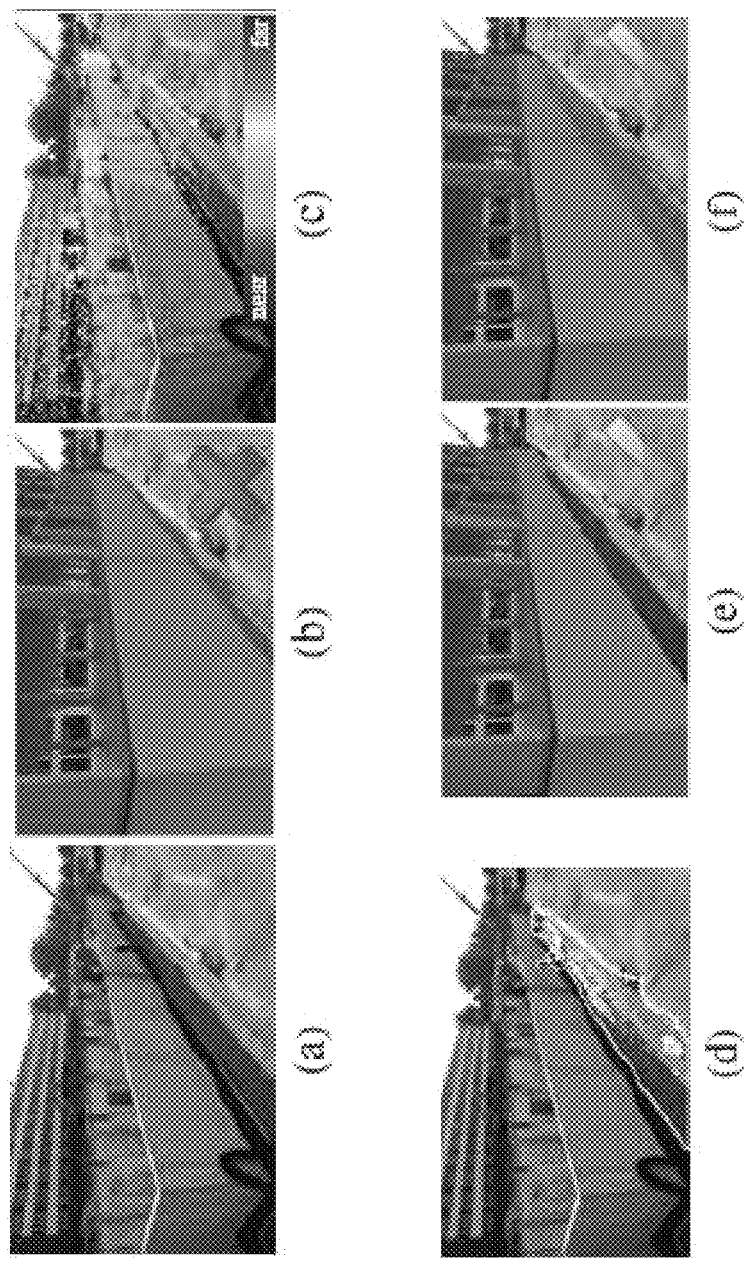
FIG. 16 is a series of photographs illustrating detection of static and dynamic occlusions including: (a) a basement of building hidden by ground; (b) the basement within mesh of BIM; (c) the point cloud of the basement estimated with SfM; (d) generation of 3D occlusion mask; (e) properly hid basement with occlusion mask; and (f) creation of x-ray (or see-through) type visualization to see through occlusion to hidden basement.

FIG. 16 is a series of photographs illustrating detection of static and dynamic occlusions including: (a) a basement of building hidden by ground; (b) the basement within mesh of BIM; (c) the point cloud of the basement estimated with SfM; (d) generation of 3D occlusion mask with 3D points that are measured to be in front of the model being propagated and smoothed based on image appearance; (e) properly hid basement with occlusion mask; and (f) creation of x-ray type visualization to see through occlusion to hidden basement.

With further reference to FIGS. 15 and 16, the processing device 110 attempts to automatically identify troublesome occlusions that can lead to unappealing visualizations. For example, a truck may be idle temporarily in front of a facade (dynamic occlusion), or certain building components may be built beneath the ground or behind other non-building structures (static occlusions). Such occlusions can be a nuisance when creating visualizations, and manually removing them may take time and expertise.

The disclosed system 100 handles the two types of occlusion (dynamic and static) separately. For dynamic occlusions, we assume that the occluding object is only in place temporarily and thus that it does not occupy the same pixels in a majority of the aligned time lapse data (as just discussed above). The processing device 110 then finds the "background" image by computing the per-pixel median of the time lapse; if our assumption holds, the moving object will be removed. To identify the pixels of the dynamic object, we compute the squared pixel-wise difference between the original image from the background, smooth the result with the cross-bilateral filter, and threshold the smoothed result, keeping pixels greater than 0.05 in any channel (FIG. 15). In other words, the thresholding could be to eliminate pixels 0.05 or less from any channel.

For static occlusions, the processing device 110 attempts to identify pixels in an image which are spatially in front of the 3D model, e.g., a fence might block a facade, or the ground may occlude the model's basement. The processing device 110 makes use of the 3D model and the sparse set of 3D points computed during the SfM procedure. For each of these 3D points, p, project onto the 3D model, we predict whether or not this point is in front of the model by evaluating the following heuristic:

$$[p - p_{model} > 0.3] \vee [\cos^{-1}(n(p)^T n(p_{model})) > \pi/6] \quad (5)$$

where $p_{model}$ is the 3D location corresponding to the point on the mesh to which p projects, and n(p) calculates the surface normal at p (estimated using nearby points for the point cloud). In other words, if p is closer to the camera by more than 0.3 m, or normals differ by more than 30°, the processing device 110 assumes the mesh is occluded at this pixel.

Since the 3D point cloud is sparse, the binary occlusion predictions may also be sparse. A superpixel may refer to a polygonal part of a digital image, larger than a normal pixel, which is rendered in the same color and brightness. To obtain a dense occlusion mask, the processing device 110 floods superpixels of the 3D sparse point cloud model with the sparse occlusion estimates (if a superpixel contains an occluded pixel, it becomes part of the occlusion mask). The processing device 110 may then smooth this mask using the bilateral filter. Our approach is shown in FIG. 16. In the event of failure either due to not enough images/triangulated points or misestimating, the user can correct errors using selection and editing tools in our interface.

Utilizing Other Building Information

Today, architectural and construction models—commonly known as building information models (BIM)—often contain rich semantic information about element interconnectivity and materials. We leverage these in our interface to improve the user's experience. Building elements are clustered by primitive, group, and type to accelerate selection in the photograph, scheduling information is used to create "snapshots" of the model's geometry at various points in time, building element material names are used to generate renderable, computer graphics materials, and GPS coordinates are used to acquire sun position (e.g. using publicly available lookup tables).

Interactions and 4D Visualization

Now that the meshes and photos are aligned and visualization tools have been prepared, a user can interact with the system using a user interface such as the GUI 136. Selections in an image can be made by one of many unique "marquee" tools: 3D building elements can be selected individually as well as grouped by type or material, and individual faces/primitives can also be selected. These semantic tools accompany standard selection tools (lasso, brush, etc.). The system's automatic occlusion masks are initialized to occlude 3D information, but can also be selected and hidden/removed if applicable.

Once a selection is made in the image, the user can perform several functions:

4D Navigation:

Slicing forward or backward in time, revealing past image data or future renderings of the 3D point cloud model (in only the selected region) as illustrated in FIG. 15.

Assess Progress:

Based on scheduling data and the progress of construction visible in the image(s), a user can quickly assess the progress of a region in the image. A color label can be given to indicate whether the component was built ahead of schedule (green), on time (semi-transparent white), or behind schedule (red), as shown in FIG. 9.

Measure Construction Deviations:

Using the underlying 3D point cloud model, the GUI 138 allows users to quickly specify the metric distance between the location of a planned building component and what was actually built in the image plane, without the use of CAD software. In the case of sparse point clouds, the user can also hand-specify the amount of construction deviation which could be useful for on-site verification and quality control purposes (FIG. 10).

Photorealistic Architectural Visualization:

A user can also specify a subset of the underlying mesh model (using selection tools within the GUI 136), and seamlessly render visible/selected mesh components into the image. Geometry, lighting, and materials are known in advance, so the 3D point cloud model can be rendered with no user interaction, and composited back into the photo using the technique of Karsch et al. [2011].

Figure 17:
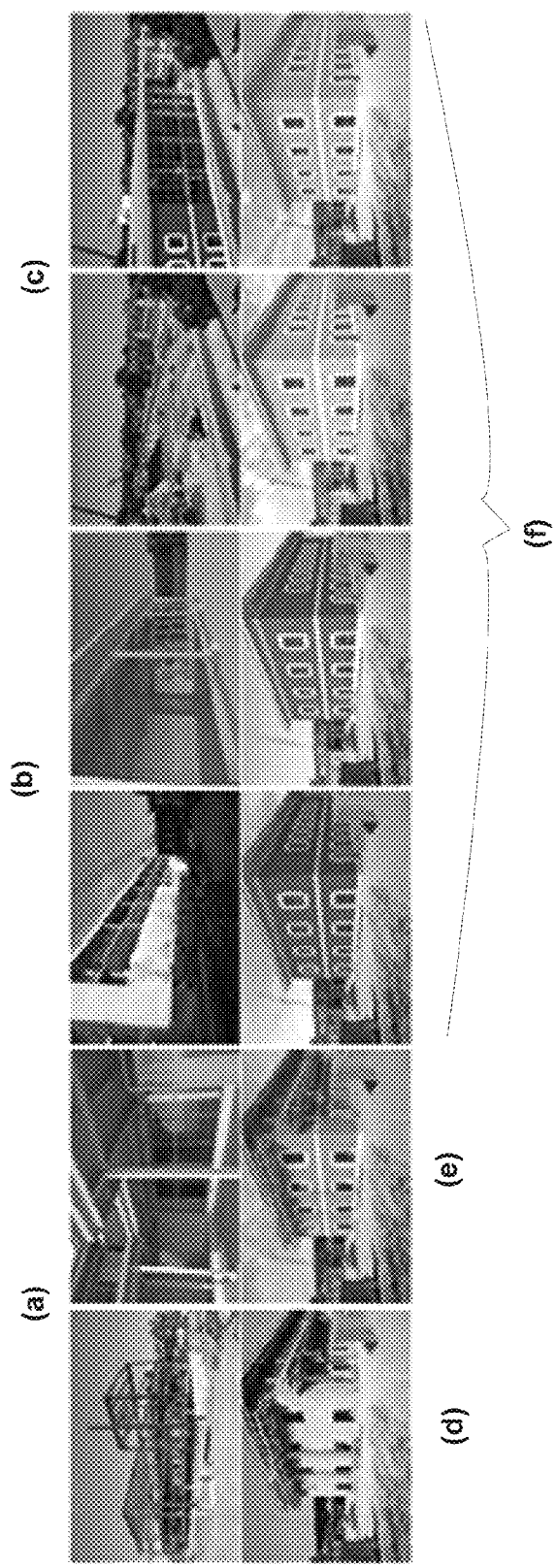
FIG. 17 is a series of photographs illustrating use of disclosed modeling to create photorealistic architectural visualization rendered into a photograph without use or knowledge of CAD, modeling, or rendering software, including each of (a), (b) and (c) being a pair of real construction images followed by a final architectural rendering; (d) a construction image; (e) a blended architectural rendering of (d); and (f) four different material and lighting choices for the scene of (e).

FIG. 17 demonstrates a rendered result, illustrating a series of photographs illustrating use of disclosed modeling to create photorealistic architectural visualization rendered into a photograph without use or knowledge of CAD, modeling, or rendering software, including each of (a), (b) and (c) being a pair of real construction images followed by a final architectural rendering; (d) a construction image; (e) a blended architectural rendering of (d); and (f) four different material and lighting choices for the scene of (e). The disclosed system 100 can be used to create photorealistic architectural visualization automatically rendered into the photograph without the use or knowledge of any CAD, modeling, or rendering software.

FIGS. 17(*a*), 17(*b*) and 17(*c*) show pairs of real construction images and the final, architectural rendering beside it. On the bottom row of FIG. 17, we show a construction image (FIG. 17(*d*)), followed by a blended architectural render (FIG. 17(*e*)), and four different material/lighting choices for the scene (FIG. 17(*f*)). The processing device may compute occlusion information, correct errors, and/or add other objects using efficient selection tools (e.g., bottom row; the truck and crane were added manually, and we make no attempt to modify the shadow cast by the fence). Time lapses and changes to materials (as in the bottom row) can be rendered with ease by swapping out preset HDRI light sources and materials.

Figure 18:
FIG. 18 is a screen shot of an exemplary view of a user interface for a user to direct aspects of the modeling and visualization desired for building progress monitoring and planning of a construction site.

FIG. 18 is a screen shot of an exemplary view of a user interface for a user to direct aspects of the modeling and visualization desired for building progress monitoring and planning of a construction site. Working from top to bottom of the menu displayed on the right, the dropdown menu titled "selection bush mode" allows selection of circle, lasso, superpixel, face, element and BIM type. The "scheduling" feature allows a user to view a visualization of a construction site generated by a 3D point cloud model as described herein according to schedule, including to view just the features that are behind schedule, and to view just the features that are ahead of schedule. The "build deviations" feature allows viewing the 4D visualization according to level of deviation from planned features with a BIM or the like.

The "4D navigation" allows navigating the 4D visualization of the construction over time, including to vfiew progress at a certain time in the past or to view how the construction site should look into the future. The "go to left cam" and "go to right cam" allows a user to see the construction site from a different angle, and other variations and numbers of cameras may be displayed and be selected by a user. The "architectural rendering" feature allows a user to "create preview rendering" based on how the construction site should appear based on a BIM or the like, or to "create physical rendering" to view the construction site as it appears in construction progress. The "automatic occlusion estimation" feature may allow a user to trigger within the system 100 to calculate static occlusion when selecting "calculate static occlusion" or to calculate dynamic occlusions when selecting "calculate dynamic occlusion."

Figure 19:
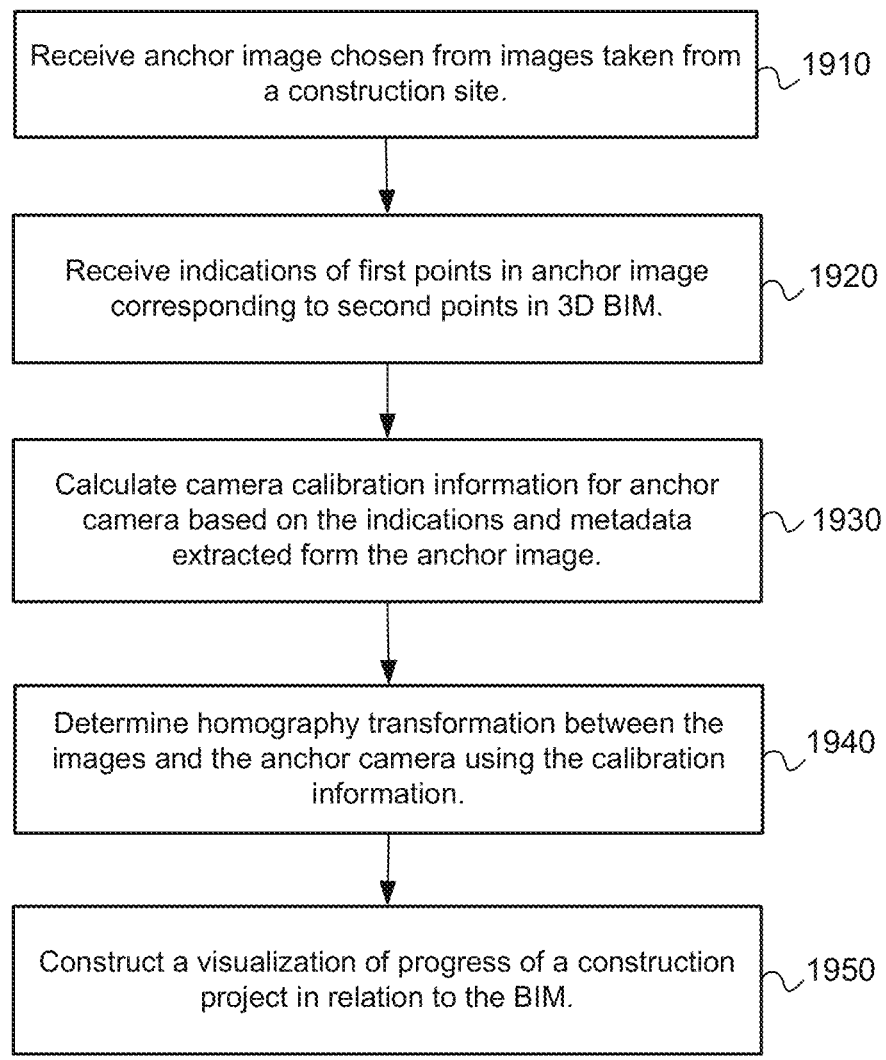
FIG. 19 is an exemplary method for modeling and visualizing a construction site according to the disclosed embodiment.

FIG. 19 is an exemplary method for modeling and visualizing a construction site according to the disclosed embodiment. The method may receive an anchor image chosen from a first plurality of images taken of a construction site (1910). The method may further receive indications of a plurality of first points in the anchor image that correspond to a plurality of second points in a 3D building information model (BIM) (1920). The method may further calculate camera calibration information for an anchor camera from which the anchor image was taken based on the indications and on metadata extracted from the anchor image, to register the anchor image in relation to the BIM (1930). The method may determine a homography transformation between the first plurality of images and the anchor camera using the camera calibration information for the anchor camera, to register a second plurality of images selected from the first plurality of images other than the anchor image, wherein some of the second plurality of images come from at least one additional camera and from an angle different than that of the anchor camera (1940). The method may further construct a visualization of progress of a construction project in relation to the BIM based on the registered anchor image and the registered second plurality of images (1950).

Figure 20:
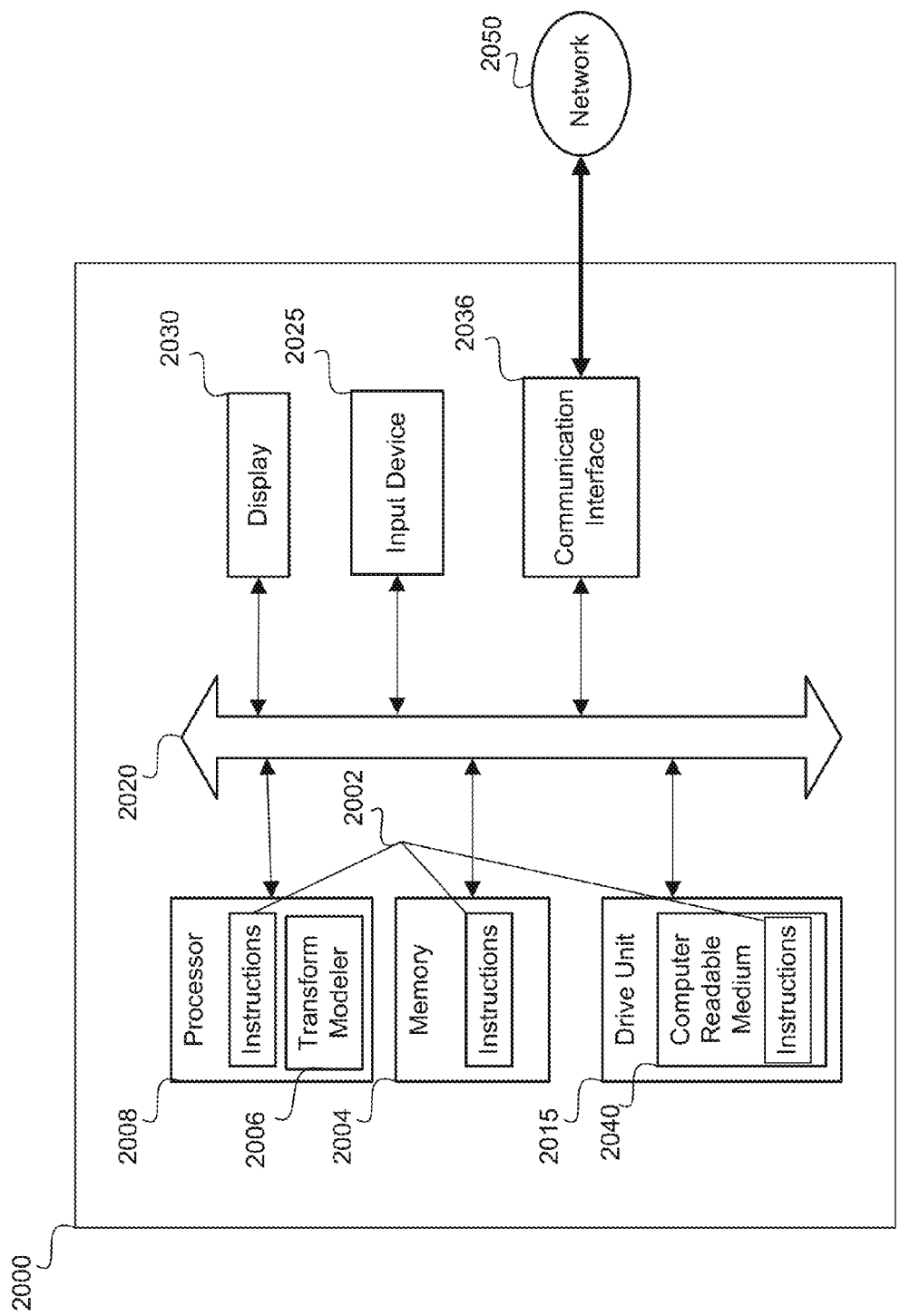
FIG. 20 is a computer system that may be used for executing the modeling and visualization techniques and embodiments disclosed herein.

FIG. 20 illustrates a general computer system 2000, which may represent the processing device 110 or any other device or system to which is referred or which is capable of executing the embodiment as disclosed herein. The computer system 2000 may include an ordered listing of a set of instructions 2002 that may be executed to cause the computer system 2000 to perform any one or more of the methods or computer-based functions disclosed herein. The computer system 2000 may operate as a stand-alone device or may be connected to other computer systems or peripheral devices, e.g., by using a network 2010.

In a networked deployment, the computer system 2000 may operate in the capacity of a server or as a client-user computer in a server-client user network environment, or as a peer computer system in a peer-to-peer (or distributed) network environment. The computer system 2000 may also be implemented as or incorporated into various devices, such as a personal computer or a mobile computing device capable of executing a set of instructions 2002 that specify actions to be taken by that machine, including and not limited to, accessing the internet or web through any form of browser. Further, each of the systems described may include any collection of sub-systems that individually or jointly execute a set, or multiple sets, of instructions to perform one or more computer functions.

The computer system 2000 may include a memory 2004 on a bus 2020 for communicating information. Code operable to cause the computer system to perform any of the acts or operations described herein may be stored in the memory 2004. The memory 2004 may be a random-access memory, read-only memory, programmable memory, hard disk drive or any other type of volatile or non-volatile memory or storage device.

The computer system 2000 may include a processor 2008, such as a central processing unit (CPU) and/or a graphics processing unit (GPU). The processor 2008 may include one or more general processors, digital signal processors, application specific integrated circuits, field programmable gate arrays, digital circuits, optical circuits, analog circuits, combinations thereof, or other now known or later-developed devices for analyzing and processing data. The processor 2008 may implement the set of instructions 2002 or other software program, such as manually-programmed or computer-generated code for implementing logical functions. The logical function or any system element described may, among other functions, process and/or convert an analog data source such as an analog electrical, audio, or video signal, or a combination thereof, to a digital data source for audio-visual purposes or other digital processing purposes such as for compatibility for computer processing.

The processor 2008 may include a transform modeler 2006 or contain instructions for execution by a transform modeler 2006 provided a part from the processor 2008. The transform modeler 2006 may include logic for executing the instructions to perform the transform modeling and image reconstruction as discussed in the present disclosure.

The computer system 2000 may also include a disk (or optical) drive unit 2015. The disk drive unit 2015 may include a non-transitory computer-readable medium 2040 in which one or more sets of instructions 2002, e.g., software, can be embedded. Further, the instructions 2002 may perform one or more of the operations as described herein. The instructions 2002 may reside completely, or at least partially, within the memory 2004 and/or within the processor 2008 during execution by the computer system 2000. Accordingly, the databases displayed and described above with reference to FIGS. 2 and 20 may be stored in the memory 2004 and/or the disk unit 2015.

The memory 2004 and the processor 2008 also may include non-transitory computer-readable media as discussed above. A "computer-readable medium," "computer-readable storage medium," "machine readable medium," "propagated-signal medium," and/or "signal-bearing medium" may include any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium.

Additionally, the computer system 2000 may include an input device 2025, such as a keyboard or mouse, configured for a user to interact with any of the components of system 2000. It may further include a display 2030, such as a liquid crystal display (LCD), a cathode ray tube (CRT), or any other display suitable for conveying information. The display 2030 may act as an interface for the user to see the functioning of the processor 2008, or specifically as an interface with the software stored in the memory 2004 or the drive unit 2015.

The computer system 2000 may include a communication interface 2036 that enables communications via the communications network 2010. The network 2010 may include wired networks, wireless networks, or combinations thereof. The communication interface 2036 network may enable communications via any number of communication standards, such as 802.11, 802.17, 802.20, WiMax, cellular telephone standards, or other communication standards.

Accordingly, the method and system may be realized in hardware, software, or a combination of hardware and software. The method and system may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. A system comprising:
   at least one processing device;
   non-transitory computer-readable medium storing a three-dimensional ("3D") building information model (BIM), a first plurality of images of a construction site, and instructions, the at least one processing device to execute the instructions to:
   receive an anchor image chosen from the first plurality of images;
   receive indications of a plurality of first points in the anchor image that correspond to a plurality of second points in the BIM;
   calculate camera calibration information for an anchor camera from which the anchor image was taken based on the indications and on metadata extracted from the anchor image, to register the anchor image in relation to the BIM, and thus generate a registered anchored image; and
   determine a homography transformation between the first plurality of images and the anchor camera using the camera calibration information for the anchor camera, to register a second plurality of images selected from the first plurality of images other than the anchor image,
   wherein some of the second plurality of images come from at least one additional camera and from an angle different than that of the anchor camera.

2. The system of claim 1, wherein the plurality of first points and the plurality of second points each comprise at least four, wherein the at least one processing device further to construct a visualization of progress of a construction project in relation to the BIM based on the registered anchor image and the registered second plurality of images.

3. The system of claim 1, wherein the metadata includes a focal length in millimeters, and wherein to calculate the camera calibration information, the at least one processing device further to:
convert, depending on a sensor size of the anchor camera, the focal length to pixels, and thus generate a converted focal length; and
execute a perspective-n-point (PnP) algorithm on the plurality of first points and the plurality of second points, using the converted focal length, to determine a plurality of intrinsic parameters and a plurality of extrinsic parameters of the anchor camera.

4. The system of claim 3, wherein the plurality of intrinsic parameters comprise (i) x and y coordinates of a center of an image and (ii) skew, wherein the at least one processing device further to execute a three-parameter pin-hole model with variable focal length and two radial distortion coefficients, to fix values of the intrinsic parameters that result in no radial distortion.

5. The system of claim 3, wherein the plurality of extrinsic parameters comprises rotation and translation.

6. The system of claim 1, wherein, to register the second plurality of images, the at least one processing device further to:
detect and match interest points across the first plurality of images;
prune the interest points using a Random Sample Consensus (RANSAC) algorithm, to generate useable interest points;
search for a third plurality of images from the second plurality of images having a percentage of inliers within a threshold percentage that include the useable interest points;
warp the first plurality of points of the anchor image to the useable interest points in the third plurality of images containing;
execute a PnP algorithm for each of the third plurality of images using known correspondences between the plurality of first points and the useable interest points, to register nearby images from the third plurality of images; and
calculate camera calibration information for one or more camera from which the third plurality of images are obtained.

7. The system of claim 1, wherein the anchor image and the second plurality of images comprises registered images, and wherein the at least one processing device further to:
execute constrained bundle adjustment on the registered images by constraining a plurality of three-dimensional points of the registered images to lie within a ray of the anchor camera when triangulated with a feature point from the anchor camera;
identify a third plurality of images from the registered images having a threshold number of features corresponding to a plurality of tracks, wherein each track comprises matched features common to two or more registered images; and
triangulate the plurality of tracks in the registered images, which correspond to the features in the third plurality of images, in relation to 3D feature points in the BIM.

8. The system of claim 7, wherein the at least one processing device further to:
select an image from the third plurality of images having fewest matches between features above a threshold number of matches; and
register a camera corresponding to the selected image by:
solving a constrained PnP problem using two-dimensional matches corresponding to the 3D feature points that were triangulated; and
making a solution to the constrained PnP problem robust with RANSAC.

9. The system of claim 8, wherein to improve the solution to the constrained PnP problem the at least one processing device further to:
use a Fundamental matrix between the anchor image and the selected image;
create epipolar lines corresponding to the plurality of first points;
constrain 3D locations within the BIM to lie near the epipolar lines; and
determine a 3D rotation and translation of the selected image that jointly minimizes reprojection error and a point-to-line distance from projected points to their corresponding epipolar lines.

10. The system of claim 7, wherein the at least one processing device further to:
identify a fourth plurality of images as the registered images other than the third plurality of images;
select an image from the fourth plurality of images with a fewest number of matching tracks;
receive an indication of a plurality of third points in the selected image corresponding to the plurality of second points in the BIM for the anchor image; and
execute a PnP algorithm for the selected image using known correspondences between the plurality of third points and the plurality of second points, to register the selected image with the BIM.

11. The system of claim 10, wherein the anchor camera comprises a first anchor camera, wherein the at least one processing device further to:
designate a camera from which the selected image is obtained as a second anchor camera; and
execute constrained bundle adjustment on the registered images by constraining a plurality of three-dimensional points of the registered images to lie within a ray of the second anchor camera when triangulated with a feature point from the second anchor camera.

12. A system comprising:
at least one processing device;
non-transitory computer-readable medium storing instructions and a three-dimensional ("3D") point cloud model of building progress of a construction site comprising time-lapsed pixels obtained from a plurality of images, the at least one processing device to execute the instructions to:
identify a structure within the 3D point cloud model that does not occupy the same pixels in a majority of the time-lapsed pixels over time;
determine a background image within the 3D point cloud model by computing a per-pixel median of the time-lapsed pixels;
compute a squared pixel-wise difference between the structure and the background image, to identify a plurality of occluding pixels of the structure; and
smooth the plurality of occluding pixels with a cross-bilateral filter, to create a smoothed occluded image removable from the 3D point cloud model.

13. The system of claim 12, wherein the at least one processing device further to threshold the smooth occluded image to eliminate time-lapsed pixels with a value of 0.05 or less in any channel.

14. The system of claim 12, wherein the at least one processing device further to remove the smoothed occluded image from the 3D point cloud model.

15. The system of claim 14, wherein the smooth occluded image is removed in response to a selection of an indicator within a graphical user interface displaying the 3D point cloud model.

16. A system comprising:
at least one processing device;
non-transitory computer-readable medium storing instructions and a three-dimensional ("3D") point cloud model of building progress of a construction site comprising pixels obtained from a plurality of images, the at least one processing device to execute the instructions to:
for each of a plurality of points within the 3D point cloud model projected from a building information model (BIM) to corresponding points in one of the plurality of images, execute a heuristic on the point comprising:

$$[p-p_{model}>0.3]v[\cos^{-1}(n(p)^T n(p_{model}))>\pi/6]$$

wherein $p_{model}$ is a location of the point on a mesh of the BIM to which the point projects and n(p) calculates a surface normal at the point, to generate estimates of sparse occlusion pixels corresponding to static occlusions;
flood superpixels of the 3D point cloud model with the estimates of the sparse occlusion pixels;
identify a plurality of the superpixels, each containing at least one of the sparse occlusion pixels; and
group the plurality of identified superpixels into an occlusion mask selectably removable from a displayed rendering of the construction site.

17. The system of claim 16, wherein a value of the n(p) is estimated using nearby points within the 3D point cloud model.

18. The system of claim 16, wherein the at least one processing device further to remove the occlusion mask from the 3D point cloud model before being displayed in a graphical user interface.

19. The system of claim 16, wherein the at least one processing device further to:
make the occlusion mask see-through for rendering; and
display the 3D point cloud model in a graphical user interface with the occlusion mask laid over the 3D point cloud model.

20. A non-transitory computer-readable medium having instructions encoded thereon that, when executed by a processing device, cause the processing device to:
receive an anchor image chosen from a first plurality of images taken of a construction site;
receive indications of a plurality of first points in the anchor image that correspond to a plurality of second points in a 3D building information model (BIM);
calculate camera calibration information for an anchor camera from which the anchor image was taken based on the indications and on metadata extracted from the anchor image, to register the anchor image in relation to the BIM, and thus generate a registered anchor image;
determine a homography transformation between the first plurality of images and the anchor camera using the camera calibration information for the anchor camera, to register a second plurality of images selected from the first plurality of images other than the anchor image, wherein some of the second plurality of images come from at least one additional camera and from an angle different than that of the anchor camera; and
construct a visualization of progress of a construction project in relation to the BIM based on the registered anchor image and the registered second plurality of images.

21. The non-transitory computer-readable medium of claim 20, wherein the plurality of first points and the plurality of second points each comprise at least four, wherein the processing device is further to execute the instruction to construct a visualization of progress of a construction project in relation to the BIM based on the registered anchor image and the registered second plurality of images.

22. The non-transitory computer-readable medium of claim 20, wherein the metadata includes a focal length in millimeters, and wherein to calculate the camera calibration information, and wherein the processing device is further to execute the instructions to:
convert, depending on a sensor size of the anchor camera, the focal length to pixels, and thus generate a converted focal length; and
execute a perspective-n-point (PnP) algorithm on the plurality of first points and the plurality of second points, using the converted focal length, to determine a plurality of intrinsic parameters and a plurality of extrinsic parameters of the anchor camera.

23. The non-transitory computer-readable medium of claim 22, wherein the plurality of intrinsic parameters comprise (i) x and y coordinates of a center of an image and (ii) skew, wherein the processing device is further to execute instructions of a three-parameter pin-hole model with variable focal length and two radial distortion coefficients, to fix values of the intrinsic parameters that result in no radial distortion.

24. The non-transitory computer-readable medium of claim 22, wherein the plurality of extrinsic parameters comprises rotation and translation.

25. The non-transitory computer-readable medium of claim 20, wherein, to register the second plurality of images, the processing device is further to execute the instructions to:
detect and match interest points across the first plurality of images;
prune the interest points using a Random Sample Consensus (RANSAC) algorithm, to generate useable interest points;
search for a third plurality of images from the second plurality of images having a percentage of inliers within a threshold percentage that include the useable interest points;
warp the first plurality of points of the anchor image to the useable interest points in the third plurality of images containing;
execute a PnP algorithm for each of the third plurality of images using known correspondences between the plurality of first points and the useable interest points, to register nearby images from the third plurality of images; and
calculate camera calibration information for one or more camera from which the third plurality of images are obtained.

26. The non-transitory computer-readable medium of claim 20, wherein the anchor image and the second plurality of images comprises registered images, and wherein the processing device is further to execute the instructions to:
  execute constrained bundle adjustment on the registered images by constraining a plurality of three-dimensional points of the registered images to lie within a ray of the anchor camera when triangulated with a feature point from the anchor camera;
  identify a third plurality of images from the registered images having a threshold number of features corresponding to a plurality of tracks, wherein each track comprises matched features common to two or more registered images; and
  triangulate the plurality of tracks in the registered images, which correspond to the features in the third plurality of images, in relation to 3D feature points in the BIM.

27. The non-transitory computer-readable medium of claim 26, wherein the processing device further to execute the instructions to:
  select an image from the third plurality of images having fewest matches between features above a threshold number of matches; and
  register a camera corresponding to the selected image by:
    solving a constrained PnP problem using two-dimensional matches corresponding to the 3D feature points that were triangulated; and
    making a solution to the constrained PnP problem robust with RANSAC.

28. The non-transitory computer-readable medium of claim 27, wherein, to improve the solution to the constrained PnP problem, the processing device is further to execute the instructions to:
  use a Fundamental matrix between the anchor image and the selected image;
  create epipolar lines corresponding to the plurality of first points;
  constrain 3D locations within the BIM to lie near the epipolar lines; and
  determine a 3D rotation and translation of the selected image that jointly minimizes reprojection error and a point-to-line distance from projected points to their corresponding epipolar lines.

29. The non-transitory computer-readable medium of claim 26, wherein the processing device is further to execute the instructions to:
  identify a fourth plurality of images as the registered images other than the third plurality of images;
  select an image from the fourth plurality of images with a fewest number of matching tracks;
  receive an indication of a plurality of third points in the selected image corresponding to the plurality of second points in the BIM for the anchor image; and
  execute a PnP algorithm for the selected image using known correspondences between the plurality of third points and the plurality of second points, to register the selected image with the BIM.

30. The non-transitory computer-readable medium of claim 28, wherein the anchor camera comprises a first anchor camera, and wherein the processing device is further to execute the instructions to:
  designate a camera from which the selected image is obtained as a second anchor camera; and
  execute constrained bundle adjustment on the registered images by constraining a plurality of three-dimensional points of the registered images to lie within a ray of the second anchor camera when triangulated with a feature point from the second anchor camera.

31. A method comprising:
  storing, by a processing device, a three-dimensional ("3D") point cloud model of building progress of a construction site comprising time-lapsed pixels obtained from a plurality of images;
  identifying, by a processing device, a structure within the 3D point cloud model that does not occupy the same pixels in a majority of the time-lapsed pixels over time;
  determining, by the processing device, a background image within the 3D point cloud model by computing a per-pixel median of the time-lapsed pixels;
  computing, by the processing device, a squared pixel-wise difference between the structure and the background image, to identify a plurality of occluding pixels of the structure; and
  smoothing, by the processing device, the plurality of occluding pixels with a cross-bilateral filter, to create a smoothed occluded image that is removable from the 3D point cloud model.

32. The method of claim 31, further comprising thresholding the smooth occluded image to eliminate time-lapsed pixels with a value of 0.05 or less in any channel.

33. The method of claim 31, further comprising removing the smoothed occluded image from the 3D point cloud model.

34. The method of claim 33, further comprising removing the smooth occluded image in response to detecting selection of an indicator within a graphical user interface displaying the 3D point cloud model.

35. A method comprising:
  storing, by a processing device, a three-dimensional ("3D") point cloud model of building progress of a construction site comprising pixels obtained from a plurality of images;
  for each of a plurality of points within the 3D point cloud model projected from a building information model (BIM) to corresponding points in one of the plurality of images:
    executing, by the processing device, a heuristic on the point comprising:
      $[p-p_{model} > 0.3] \lor [\cos^{-1}(n(p)_T n(p_{model})) > \pi/6]$,
      wherein $p_{model}$ is a location of the point on a mesh of the BIM to which the point projects and $n(p)$ calculates a surface normal at the point, to generate estimates of sparse occlusion pixels corresponding to static occlusions;
    flooding, by the processing device, superpixels of the 3D point cloud model with the estimates of the sparse occlusion pixels;
    identifying, by the processing device, a plurality of the superpixels, each containing at least one of the sparse occlusion pixels; and
    grouping, by the processing device, the plurality of identified superpixels into an occlusion mask that is selectably removable from a displayed rendering of the construction site.

36. The method of claim 35, further comprising estimating a value of the $n(p)$ using nearby points within the 3D point cloud model.

37. The method of claim 35, further comprising removing the occlusion mask from the 3D point cloud model before being displayed in a graphical user interface.

38. The method of claim 35, further comprising:
making the occlusion mask see-through for rendering; and
displaying the 3D point cloud model in a graphical user interface with the occlusion mask laid over the 3D point cloud model.

\* \* \* \* \*

UNITED STATES PATENT AND TRADEMARK OFFICE
CERTIFICATE OF CORRECTION

PATENT NO.         : 9,852,238 B2
APPLICATION NO.    : 14/690104
DATED              : December 26, 2017
INVENTOR(S)        : David Alexander Forsyth et al.

Page 1 of 1

It is certified that error appears in the above-identified patent and that said Letters Patent is hereby corrected as shown below:

On the Title Page

In ITEM (54):
Change "VIZUALIZATION" to --VISUALIZATION--

Signed and Sealed this
Fifth Day of June, 2018

Andrei Iancu
*Director of the United States Patent and Trademark Office*